United States Patent [19]

Fukami et al.

[11] Patent Number: 5,448,515

[45] Date of Patent: Sep. 5, 1995

[54] MAGNETIC THIN FILM MEMORY AND RECORDING/REPRODUCTION METHOD THEREFOR

[75] Inventors: Tatsuya Fukami; Motohisa Taguchi; Yuji Kawano; Kazuhiko Tsutsumi, all of Amagasaki, Japan

[73] Assignee: Mitsubishi Denki Kabushiki Kaisha, Tokyo, Japan

[21] Appl. No.: 107,148

[22] Filed: Aug. 17, 1993

[30] Foreign Application Priority Data

Sep. 2, 1992 [JP] Japan .................. 4-234539
Apr. 13, 1993 [JP] Japan .................. 5-086175

[51] Int. Cl.⁶ ............................................. G11C 11/14
[52] U.S. Cl. .................................... 365/171; 365/173
[58] Field of Search .................... 365/171, 173, 158

[56] References Cited

U.S. PATENT DOCUMENTS

| | | | |
|---|---|---|---|
| 3,350,180 | 10/1967 | Croll | 365/173 |
| 3,375,091 | 3/1968 | Feldtkeller | 365/173 |
| 3,524,173 | 8/1970 | Wolf | 365/173 |
| 4,897,288 | 1/1990 | Jenson | 427/123 |
| 5,173,873 | 12/1992 | Wu et al. | 365/173 |

OTHER PUBLICATIONS

A. V. Pobm et al., "The Design of a One Magabit Non-Volatile M-R Memory Chip Using 1.5×5 μm Cells", *IEEE Transactions on Magnetics*, vol. 24, No. 6, Nov. 1988, pp. 3117-3119.

I. W. Ranmuthu et al., "Reprogrammable Logic Array Using M-R Elements", *IEEE Transactions on Magnetics*, vol. 26, No. 5, Sep. 1990, pp. 2828-2830.

"Magnetic Thin Film Technology", *Electrical Engineering Lectures*, vol. 5, Maruzen Co., 1977, pp. 254-257.

Primary Examiner—Joseph A. Popek
Attorney, Agent, or Firm—Burns, Doane, Swecker & Mathis

[57] ABSTRACT

A magnetic thin film memory is provided including a plurality of magnetic thin film memory elements each adapted to record information on the basis of the direction of magnetization of a magnetic thin film thereof, the magnetic thin film memory elements being each composed of at least the magnetic thin film and a switching element. With such a constitution the magnetic thin film memory can be reduced in size while a sufficiently large signal can be obtained with a substantially improved SN ratio. A method for recording and reproduction information using the magnetic thin film memory is also provided. In another aspect, the present invention provides a magnetic thin film memory element including at least two kinds of magnetic layer, and a nonmagnetic layer which is interposed between the magnetic layers wherein the two kinds of magnetic layers are stacked so as to be coupled to each other by an exchange interaction through the nonmagnetic layer.

21 Claims, 22 Drawing Sheets

MAGNETIZATION DIRECTION OF LAYER 5b
MAGNETIZATION DIRECTION OF LAYER 5a

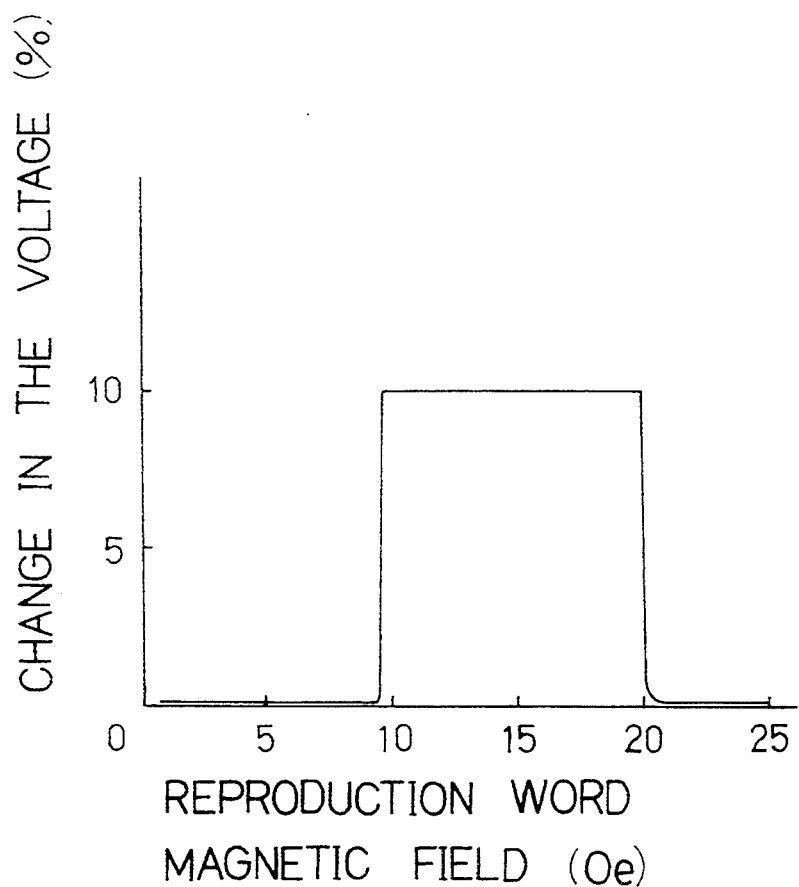

MAGNETIZATION DIRECTION OF LAYER 5b
MAGNETIZATION DIRECTION OF LAYER 5a

83

"1"  "0"

"1"  "0"

MAGNETIC THIN FILM MEMORY AND RECORDING/REPRODUCTION METHOD THEREFOR

BACKGROUND OF THE INVENTION

The present invention relates to a memory employing a magnetic thin film, and to a recording/reproduction method for such a memory. More particularly, it relates to a magnetic thin film memory adapted to record information on the basis of the direction of magnetization, and to a recording/reproduction method therefor.

FIG. 18 an explanatory view schematically illustrating a conventional magnetic thin film memory in assembled condition which is disclosed in "Magnetic Thin Film Technology," *Electrical Engineering Lectures* Vol. 5, MARUZEN Co., 1977, p. 254.

To be described first is an example of a process for manufacturing such a conventional magnetic thin film memory. A flat smooth glass substrate is closely covered with a mask having rectangular apertures. A Fe-Ni alloy film is then formed to have a thickness of about 2000 Å on the thus masked substrate in a vacuum evaporator. Thus, a multiplicity of memory elements MF are provided in a matrix configuration at a time. Wires for driving the memory elements are formed by forming copper wires on both sides of a thin plate of epoxy resin or a polyester sheet by photoetching technology so as to cross each other at right angles. The wires on respective side of the plate or sheet are word lines and bit lines, respectively. The memory elements and the wires are assembled together by pressing the wires against the memory elements so that the cross point of the wires are located on each of the memory elements.

To be described next is the principle of operations of the conventional magnetic thin film memory. In FIG. 18, wires $W_1$ to $W_3$ disposed parallel to the easy magnetic axis are word lines, while wires $D_1$ to $D_3$ crossing the wires $W_1$ to $W_3$ at right angles are digit lines. Each of the digit lines $D_1$ to $D_3$ also functions as a sense line for reading the state of the bit stored.

Arrows C and E, respectively, indicate the directions of magnetization of magnetic thin films which correspond to the respective states of the bit stored. The arrow C upwardly orienting in the drawing herein means that information "0" is recorded, while the arrow E downwardly orienting means that information "1" is recorded. Further, magnetic fields Hd and Hw, herein, are generated by a digit current Id and a word current Iw, respectively, and exerted on the magnetic thin films. When the word current Iw, which is of single-polarity pulse, is made to flow to the word line $W_1$ selectively, all the memory elements under the word line $W_1$ are provided with the magnetic field Hw and, as a result, the direction of magnetization thereof orients along the hard magnetic axis. Depending on whether the magnetization is rotated from the state for "1" or "0", pulse voltages different in polarity are induced in respective digit lines. These pulse voltages function as readout voltage. When information is to be recorded, the current Id is made to flow at the same time when pulses of the current Iw fall, whereby the magnetic field Hd corresponding to an information signal is generated on the magnetic thin film under the digit line of which magnetization is aligned along the hard magnetic axis. The direction of magnetization is determined by the composite vector of both magnetic fields Hw and Hd, so that information of "1" or "0" can be recorded in each of the memory elements. The current Iw is a value of an electrical current such as to generate the magnetic field Hw capable of rotating the magnetization on the magnetic thin film from the easy magnetic axis to the hard magnetic axis. The current Id is a value of an electrical current such as to generate the magnetic field Hw which is about a half of the coercive force Hc of the magnetic thin film.

FIG. 19(a) schematically shows the structure of another prior art magnetic thin film memory which is disclosed in, for example, IEEE TRANSACTIONS ON MAGNETICS, Vol. 24, No. 6, 1988, pp. 3117 to 3119. FIG. 19(b) is a fragmentary section showing one element portion of the memory shown in FIG. 19(a). In FIG. 19(b) numeral 1 denotes an MR(magneto-resistive) layer, numeral 2 denotes a sense line, numeral denotes 3 a word line, and numeral 4 denotes an insulating layer.

Binary information ("0" or "1") is recorded as the direction of magnetization (upward or downward in the drawing). The MR layer 1 is composed of Fe and Ni together with a faint amount of Co and designed so that the easy magnetic axis thereof would extend vertically in the drawing.

To be specifically described is the process of recording to such a magnetic thin film memory.

When a random access recording is to be performed to, for example, a memory element 111 in FIG. 19(a), current is made to flow in a sense line 21 and a word line 31 which pass through the memory element 111, selectively among the sense lines and word lines. The recording sense current flowing through the sense line 21 produces at the memory element 111 a recording sense magnetic field orienting upward or downward in the drawing. The direction of the recording sense magnetic field, upward or downward, is determined by the direction of the recording sense current, leftward or rightward in the drawing. On the other hand, the recording word current flowing through the word line 31 produces at the memory element 111 a recording word magnetic field orienting leftward or rightward. Unlike the sense current, the word current may be made to flow in one direction. For example, it is made to flow in a direction such that the recording word magnetic field orients rightward. Thus, the recording sense magnetic field and the recording word magnetic field are applied to the memory element 111. A change in the magnetization state of the memory element 111 in this recording operation is shown in FIG. 20.

FIG. 20(a) shows the magnetization state of the MR layer before application of magnetic field. The magnetization state, whether upward or downward, before application of a magnetic field has nothing to do with the subsequent recording process. If the recording sense magnetic field produced by making current flow in the sense line orients upward, a composite magnetic field composed of recording sense magnetic field 82 and recording word magnetic field 83 orients in the upper-right direction as shown in FIG. 20(b), and the magnetization also orients in the upper-right direction as shown in FIG. 20(c). When the magnetic field is eliminated (i.e. when the current is stopped), the magnetization orients upward along the easy magnetic axis as shown in FIG. 20(d), hence, assumes a stable condition. On the other hand, if the recording sense magnetic field orients downward, a composite magnetic field 85 composed of recording sense magnetic field 82 and recording word magnetic field 83 orients in the lower-right direction as shown in FIG. 20(e), and the magnetization also orients in the same direction as shown in FIG. 20(f). When the magnetic field is eliminated, the magnetization orients downward as shown in FIG. 20(g) and assumes a stable condition. Thus, changing the direction of the recording sense current enables recording in the direction, upward or downward. In FIG. 19, a magnetic field is also applied to memory elements 112, 113 . . . , 121, 131 . . . as well as the memory element 111. However, these memory elements other than the memory element 111 are applied with just either the recording sense magnetic field or the recording word magnetic field. This is insufficient to reverse the magnetization, hence, the initial recording state is retained. From the reversed point of view, values of the recording sense current and recording word current need to be selected so that the magnetization of only the memory element 111 would be reversed. The above-mentioned is the principle of recording.

The principle of reproduction is as follows:

When a random access reproduction is to be performed on, for example, the memory element 111 in FIG. 19, current is made to flow in the sense line 21 and word line 31. At this time, the reproduction sense current flowing through the sense line 21 and the reproduction word current flowing through the word line 31 produces at the memory element 111 a reproduction sense magnetic field and a reproduction word magnetic field, respectively. These reproduction magnetic fields are set smaller than the recording magnetic fields. Therefore, recorded information will never be destroyed.

The reproduction operation by these magnetic fields is described with reference to FIG. 21. As shown in FIG. 21(b), the direction of current is predetermined so that a reproduction sense magnetic field 82 would orient upward and a reproduction word magnetic field 83 rightward. Hence, a composite magnetic field 85 orients in the upper-right direction. Under the influence of the composite magnetic field 85, the upward-oriented magnetization of an upward record (FIG. 21(a)) is slightly inclined to the upper right (FIG. 21(c)). On the other side, the downward-oriented magnetization of a downward record (FIG. 21(e)) is inclined at a larger angle (FIG. 21(f)). When the magnetic field is eliminated, the magnetization in either case resumes its original recording state (FIGS. 21(d) and 21(g)).

Referring to FIG. 22, let the angle formed by the direction of the sense current and the direction of the magnetization be $\phi$, then the resistance R due to the so-called "anisotropic MR effect" is given by the equation:

$$R = R_o(1 + \Delta \cos^2 \phi)$$

where $R_o$ is a resistance when the direction of magnetization is parallel, and $\Delta$ is a MR coefficient which is determined by the material. Accordingly, when the resistance between the opposite ends of the sense line is measured, in the case of the recording state of FIG. 21(c), just a small change in the resistance occurs because the angle determined by the direction of the magnetization with respect to that of the sense current is large. In the case of the recording state of FIG. 21(f), on the other hand, a large change in the resistance occurs because the angle determined by the direction of the magnetization with respect to that of the sense current is small. In practice, since the reproduction current is constant and the resistance between the opposite ends of the sense line is proportional to the voltage therebetween, the voltage is measured for reproduction.

As can be understood from the above, a small change in voltage occurs in the case of upward magnetization, whereas a large change in voltage occurs in the case of downward magnetization. Although a plurality of memory elements are connected in series on the sense line in FIG. 19, memory elements other than the memory element 111 are not applied with the reproduction word magnetic field. Hence, they are free of change in resistance and will not contribute to reproduction. Accordingly, the information written in the memory element 111 only is selectively reproduced. The principle of reproduction is as above.

The prior art magnetic thin film memories utilize, in reading, an anisotropic MR effect such that the resistance changes depending on the angle of the magnetization direction of a MR layer with respect to the direction of current or a very small electromagnetic induction voltage produced by rotation of the magnetization. For this reason, the rate of change in resistance is very small, or as small as about 0.5% and, hence, the SN ratio must be improved by carrying out an averaging treatment for several microseconds, so as to secure a sufficient SN ratio for reproduction. The averaging treatment for such a long time causes the access time for reproduction to be lengthened and the data transfer rate to be degraded, raising a problem of limited use of the memory.

Further, utilizing an electromagnetic induction in reading, the magnetic thin film needs to be large enough in size because the electromagnetic induction voltage is proportional to the magnitude of magnetic moment. For this reason, there arises another problem that it is impossible to increase the amount for recording information per unit area of the magnetic thin film.

An object of the present invention is to provide a magnetic thin film memory which offers a remarkably improved SN ratio, largely shortened access time and greatly enhanced data transfer rate while performing an increased recording capacity per unit area, and to provide a recording/reproduction method therefor.

To overcome the foregoing problems, it was formerly proposed that a magnetic thin film memory element employing a method wherein information is recorded on the basis of the direction of the magnetization of a magnetic thin film and the recorded information is read out utilizing a change in resistance of the magnetic thin film due to a magnetoresistive effect, the magnetic thin film comprising a magnetic layer a̱ having a large coercive force, a magnetic layer ḇ having a small coercive force, and a nonmagnetic layer c̱, the layers a̱, ḇ and c̱ being stacked in the sequence of a̱/c̱/ḇ/c̱/a̱/c̱/ḇ/c̱ . . . with the layer c̱ interposed between the layers a̱ and ḇ and vice versa. In addition, there was proposed a magnetic thin film memory element employing a method wherein information is recorded on the basis of the direction of magnetization of a magnetic thin film and the recorded information is read out utilizing a change in resistance of the magnetic thin film due to a magnetoresistive effect, the magnetic thin film comprising a magnetic layer a̱ having a large coercive force, a magnetic layer ḇ having a small coercive force, and a nonmagnetic layer c̱, the layers a̱, ḇ and c̱ being stacked in the sequence of a̱/c̱/ḇ/c̱/a̱/c̱/ḇ/c̱/ . . . with the layer c̱ interposed between the layers a̱ and ḇ and vice versa, wherein information is recorded on the basis of the direction of magnetization of the magnetic layer b (refer to Japanese Patent Application No. 63028/1992).

The above memory elements were confirmed to have such an effect that a sufficiently large read signal can be obtained even if the memory element is reduced in size.

SUMMARY OF THE INVENTION

According to one aspect of the present invention, there is provided a magnetic thin film memory element comprising: at least two kinds of magnetic layers composed of a magnetic material having a large coercive force and other magnetic material having a small coercive force, and a nonmagnetic layer which is interposed between said magnetic layers, wherein said two kinds of magnetic layers are stacked so as to be coupled with each other across said nonmagnetic layer by an exchange interaction.

In the above magnetic thin film memory element, said at least two kinds of magnetic layers are coupled to each other so that the respective directions of magnetization thereof would be parallel or antiparallel to each other when an external magnetic field is 0. The terms "parallel" and "antiparallel" herein means that the respective directions of magnetization of the two magnetic layers are in the same direction, and that they are in opposite directions, respectively.

It is preferable that said at least two kinds of magnetic layers are coupled with each other so that the respective directions of magnetization thereof are antiparallel to each other when an external magnetic field is absent.

Preferably, the aforementioned magnetic layers and nonmagnetic layer are each made of a good conductor so as to increase the rate of change in resistance.

The nonmagnetic layer, preferably, is mainly composed of Cu because the Fermi energy level of Cu is near that of the magnetic layers and Cu has a superior property capable of coupling with the magnetic layers, thereby a difference in resistance tends to occur depending on the angle of magnetization of the magnetic layer adjacent this nonmagnetic layer.

There is also provided a magnetic thin film memory comprising a plurality of memory elements of the type described above which are arranged in a matrix pattern, a sense line connecting a row or column of the memory elements in series, and a word line disposed adjacent the memory elements crossing the sense line.

In view of decreasing the coercive force of the magnetic layer so as to decrease the current needed for recording or reproduction, preferably said plurality of memory elements are arranged so that the respective easy magnetic axes of the magnetic layers of each memory element would orient parallel to the sense line.

Further, in view of effectively utilizing a word magnetic field thereby to decrease the consumed electric power, preferably said plurality of memory elements are arranged so that the respective easy magnetic axes of the magnetic layers of each memory element would orient perpendicular to the word line.

There is further provided a magnetic thin film memory comprising the memory elements arranged in the row direction and in the column direction, each magnetic layer of which is formed into a stripe so as to parallel each other, a plurality of word lines arranged so as to closely parallel each other, and so as to be crossed by the stripes, and a plurality of sense lines closely arranged on the strides with which the word line is not crossed. In this arrangement, a difference in height which would be a hindrance in connecting the sense line to the MR layers is not produced. This leads to improved reliability of the device. In addition, since current flows through the sense line having a smaller resistance, not through the MR layer, other properties of the device can be maintained.

There is further provided a method for recording information in a magnetic thin film memory including memory elements of the type described above which are arranged in a matrix pattern, sense lines and word lines, the method comprising: determining the direction of magnetization of the magnetic layer having a large coercive force with a composite magnetic field produced by making current flow through the word line and the sense line, and changing the direction of current flowing through the word line so that the state of "0" or "1" is recorded.

In view of recording with decreased current, preferably recording is effected so that said direction of magnetization would orient substantially parallel to the sense line.

Further, in view of effective utilization of a recording word magnetic field, preferably recording is effected so that said direction of magnetization would orient substantially perpendicular to the word line.

There is still further provided a method for reproducing information in a magnetic thin film memory including memory elements of the type described above which are arranged in a matrix pattern, sense lines and word lines, the method utilizing a change in resistance due to a reversal of magnetization of only the magnetic layer having a small coercive force in each of the memory elements which is caused by a magnetic field produced by word current for reproduction.

Preferably, said change in resistance is measured between the opposite ends of the sense line connecting a row or column of the memory elements in series. This is because different memory elements can be sequentially measured in the same way.

In view of assured reproduction without destroying recorded information, a magnetic field produced by word current is preferably larger than the magnetic field reversing the magnetization of the magnetic layer having a small coercive force and smaller than the magnetic layer reversing the magnetization of the megnetic layer having a large coercive force.

A magnetic thin film memory according to another aspect of the present invention is provided with a switching element. The provision of the switching element allows recording and reproduction using the same line and thereby accomplishes a high-density memory.

According to the present invention, there is provided a magnetic thin film memory including a plurality of magnetic thin film memory elements each adapted to record information on the basis of a direction of magnetization of a magnetic thin film thereof, each of the magnetic thin film memory elements Ming composed of at least the magnetic thin film and a switching element.

According to the present invention as described in claim 21, there is also provided a method for recording information in a magnetic thin film memory, including using only a data line disposed so as to come into contact with a magnetic thin film in which a magnetic layer a having a large coercive force, a magnetic layer b having a small coercive force and a nonmagnetic layer c are stacked in the sequence of a/c/b/c/a/c/b/c . . . with the layer c interposed between the layer a and the layer b and vice versa; and changing the direction of magnetization of the magnetic layer b on the basis of the direction, (positive or negative), of the current to flow through the data line, thereby to record information.

According to the present invention as described in claim 22, the current is preferably made to flow through the data line such that a magnetic field generated thereby does not change the direction of magnetization of the magnetic layer a having a large coercive force in the above method.

According to the present invention, there is still also provided a method for reproduction information recorded in a magnetic thin film memory, reading a regenerative signal by utilizing a difference in the resistance of a magnetic thin film in which a magnetic layer a having a large coercive force, a magnetic layer b having a small coercive force and a nonmagnetic layer c are stacked in the sequence of a/c/b/c/a/c/b/c . . . with the nonmagnetic layer c interposed between the layer a and the layer b and between the layer b and the layer a, which difference is produced by a defference of the direction of magnetization of the magnetic layer b having a small coercive force.

In the magnetic thin film memory element of the present invention, there is used as a memory element an MR layer wherein a magnetic layer having a large coercive force and a magnetic layer having a small coercive force are coupled by exchange interaction with each other through a nonmagnetic layer. Hence, by applying a reproduction magnetic field to change the direction of magnetization of the magnetic layer having a small coercive force, a large change in resistance at the interface between the magnetic layer and the nonmagnetic layer can be detected, thereby assuredly reproduction information with a high SN ratio. Specifically, in a ferromagnetic exchange coupling wherein the respective directions of magnetization of the two magnetic layers are parallel to each other, there is a change of about 10% in resistivity when the magnetization state is changed from the parallel state to the antiparallel state. On the other hand, in an antiferromagnetic exchange coupling wherein the respective directions of magnetization of the two magnetic layers are antiparallel to each other, there is a change of about 20% in resistivity.

In recording information, a composite magnetic field produced by a word line and sense line is made larger than the coercive force of the magnetic layer having a large coercive force, and information "0" or "1" is recorded by changing a direction of current flow through the record word line.

Further, in accordance with the magnetic thin film memory using the switching element, as a magnetic thin film in which the magnetic layer a having a large coercive force, magnetic layer b having a small coercive force and nonmagnetic layer c are stacked in the sequence of a/c/b/c/a/c/b/c . . . with the nonmagnetic layer c interposed between the magnetic layer a and the magnetic layer b and vice versa. Hence, by selectively applying magnetic fields of different directions in a plane parallel to the plane of the thin film, the direction of magnetization of the magnetic layer b having a small coercive force is changed, thereby recording the information state for "0" or "1".

Further, the provision of one switching element for sensing makes it possible to perform recording with use of the same line as for reproduction. Hence, there is no need to particularly provide a line for recording. This leads to a memory of higher density.

Further, a resistance of the memory element in which the magnetization direction of the magnetic layer a has the same direction as that of the magnetic layer b (parallel magnetization) is different from a resistance of the memory element in which the direction of the magnetization spin in the magnetic of each layer a is opposite to that in the magnetic layer b (antiparallel magnetization). Accordingly, reproduction of information is achieved without use of a bias magnetic field since the magnetic thin film of the present invention employs the change in resistance between the state of the parallel magnetization and antiparallel magnetization. In addition, since the rate of change in resistance is large, the recording states for "0" or "1" can be discriminated from each other by comparing a voltage $V_B$ across the element in the case of parallel magnetization with a voltage $V_A$ across the element in the case of antiparallel megnetization.

BRIEF EXPLANATION OF THE DRAWINGS

FIG. 6 is a diagram showing a change in the voltage of the ferromagnetically-coupled MR layer of Example 1 upon application of a reproduction word magnetic field;

DETAILED DESCRIPTION

Hereinafter the present invention will be described in detail with reference to the drawings.

Figure 1A:
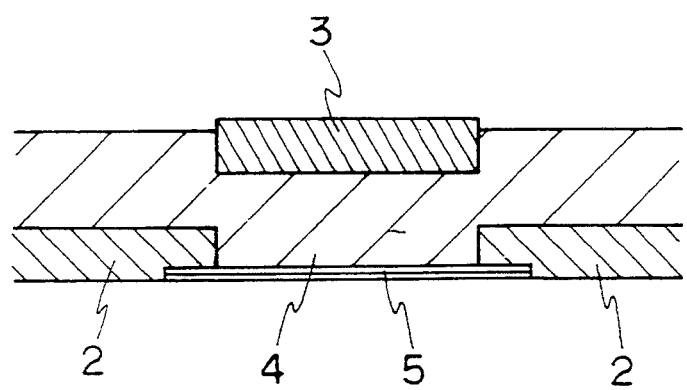
FIGS. 1(a) and 1(b) are schematic sectional views showing one embodiment of a magnetic thin film memory element utilizing exchange coupling according to the present invention.
Figure 1B:
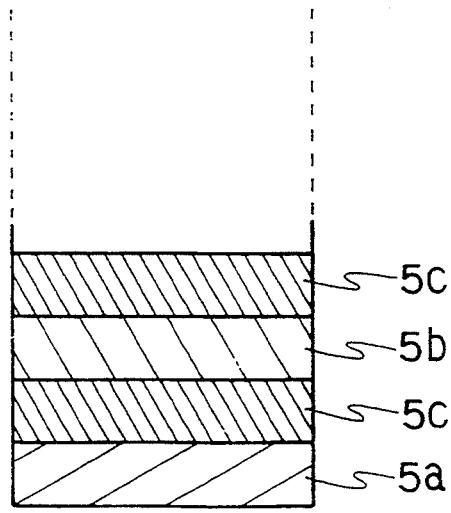
Figure 2:
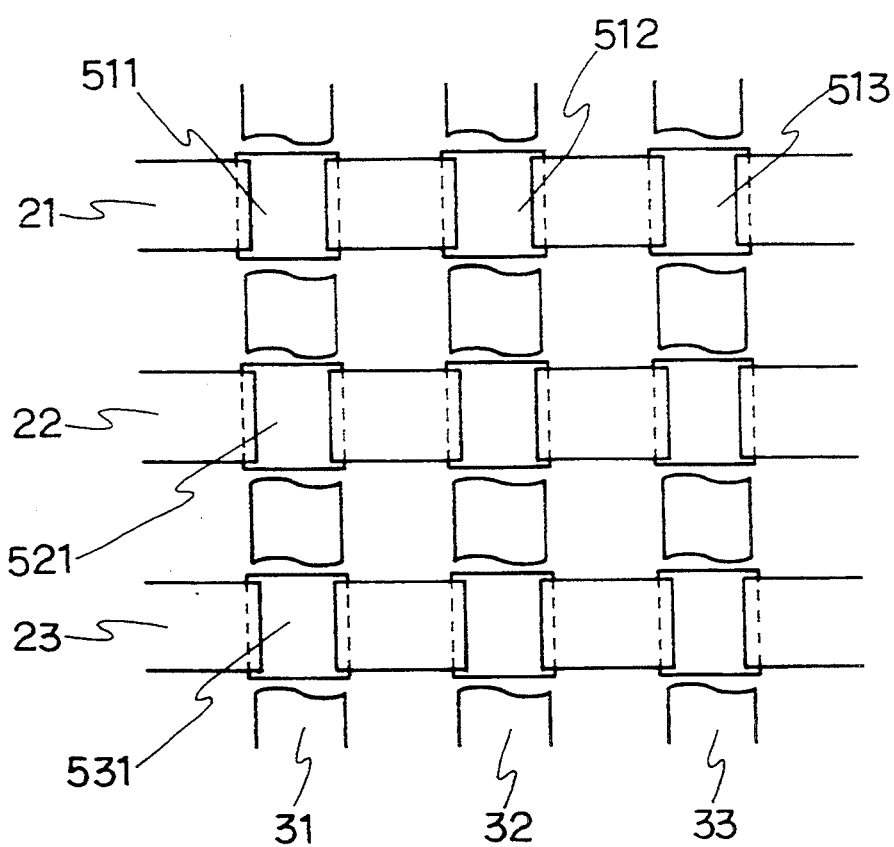
FIG. 2 is a plan view showing the structure of one embodiment of a magnetic thin film memory utilizing exchange coupling according to the present invention.

FIG. 1(a) is a schematic sectional view showing the magnetic thin film memory element of the present invention. FIG. 1(b) is an enlarged sectional view showing an MR layer of the magnetic thin film memory element. FIG. 2 is an explanatory plan view showing a magnetic thin film memory wherein magnetic thin film memory elements are arranged in a matrix pattern.

Figure 19A:
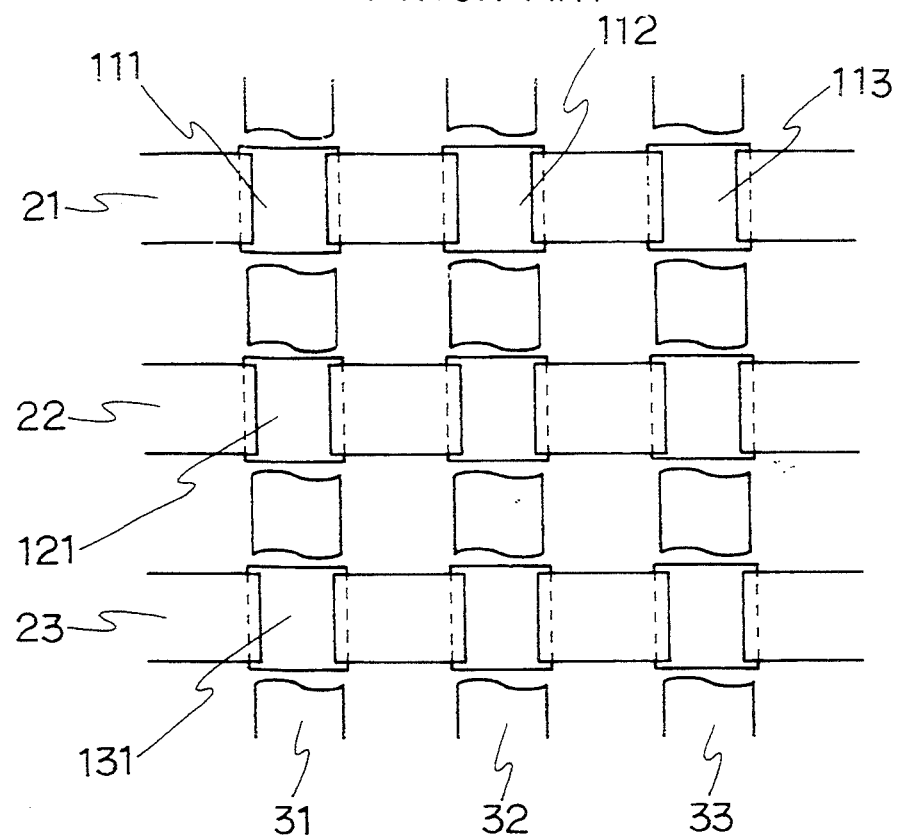
FIGS. 19(a) and 19(b) are plan views showing the structure of another example of a conventional magnetic thin film memory.
Figure 19B:
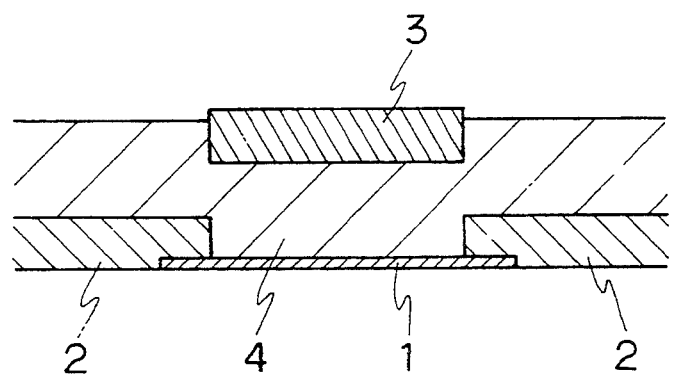
Figure 20A:
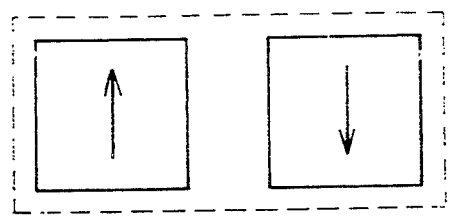
FIGS. 20(a)-20(g) are explanatory views showing a change in the magnetization state of an MR layer of the conventional memory in recording.
Figure 20B:
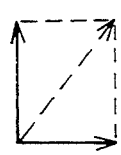
Figure 20E:
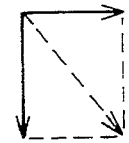
Figure 20C:
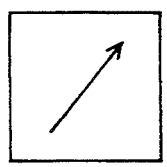
Figure 20F:
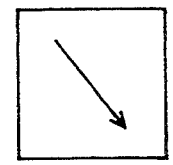
Figure 20D:
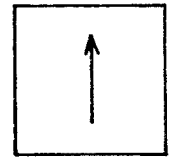
Figure 20G:
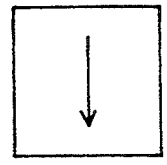
Figure 21A:
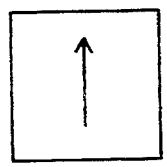
FIGS. 21(a)-21(g) are explanatory views showing a change in the magnetization state of the MR layer of the conventional memory in reproduction.
Figure 21E:
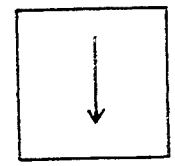
Figure 21B:
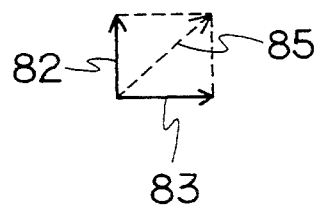
Figure 21C:
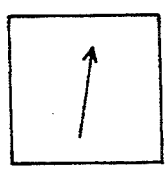
Figure 21F:
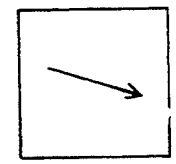
Figure 21D:
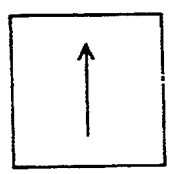
Figure 21G:
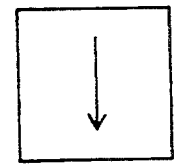
Figure 22:
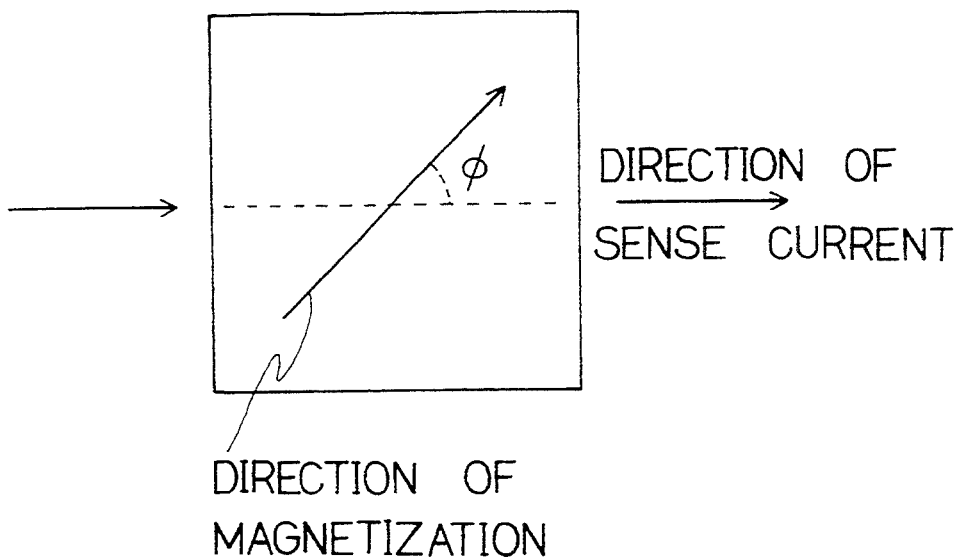
FIG. 22 is an explanatory view showing an anisotropic MR effect.

In FIG. 1, numerals 2 to 4 denote corresponding parts in FIG. 19(b). Numeral 5 denotes an MR layer wherein, as shown in FIG. 1(b), a first magnetic layer 5a having a small coercive force and a second magnetic layer 5b having a large coercive force are stacked with a nonmagnetic layer 5c interposed. The first magnetic layer 5a and the second magnetic layer 5b are coupled by exchange interaction with each other. As the second magnetic layer 5b having a large coercive force, one having a coercive force of, for example, about 10 to 30 Oe is used. Materials to be usually used for such a magnetic layer include $Fe_xCo_{100-x}$ ($0<X<50$), $Ni_y(Fe_x$-$CO_{100-x})_{100-y}$ ($0 \leq X \leq 50$, $0<y \leq 20$), and the like. As the first magnetic layer 5a having a small coercive force, one having a coercive force of about at most a half of that of the second magnetic layer is used. Materials to be usually used for such a magnetic layer include $Fe_{80}Ni_{20}$, $Ni_q(Fe_pCo_{100-p})_{100-q}$ ($50 \leq p \leq 90$, $0 < q \leq 100$), and the like. However, there is no particular limitation to these materials as far as there is a difference in coercive force between the first magnetic layer 5a and the second magnetic layer 5b.

The nonmagnetic layer 5c, serving to exchange coupling the first magnetic layer 5a and the second magnetic layer 5b, is preferably a good conductor. In particular, a nonmagnetic material mainly composed of Cu is convenient to obtain a large MR ratio because it has a Fermi energy level near that of the magnetic layers and a superior property capable of coupling thereto, so that a resistance is likely to be produced at the interface when the direction of magnetization is rotated. The exchange coupling between the first magnetic layer 5a and second magnetic layer 5b leads to an exchange coupling having a ferromagnetic exchange interaction and an exchange coupling having an antiferromagnetic exchange interaction, each exchange interaction of which alternately appears depending on the thickness of the nonmagnetic layer 5c. That is, when the nonmagnetic layer is absent between the first and second magnetic layers, only a ferromagnetic exchange coupling appears, whereas as the thickness of the nonmagnetic layer 5c is made larger, an antiferromagnetic exchange coupling appears periodically at, for example, about 10 Å or about 25 Å. However, the larger the thickness thereof becomes the smaller the coupling force becomes. Since the ferromagnetic exchange coupling and the antiferromagnetic exchange coupling appear alternately and periodically depending on the thickness of the nonmagnetic layer, the nonmagnetic layer is made to have about a half of the thickness at which the antiferromagnetic exchange coupling appears so as to obtain the ferromagnetic exchange coupling. Note that the exchange coupling force becomes weak when the thickness of the nonmagnetic layer is 50 Å or more and, therefore, it is preferably smaller than 50 Å.

Preferably, each of the magnetic layers is about 10 to about 80 Å thick. It is preferable to provide at most 40 sequences of first magnetic layer/nonmagnetic layer/second magnetic layer/nonmagnetic layer, more preferably 5 to 20 sequences. This is because although a larger number of sequences makes the MR ratio larger, a too large number of sequences results in a thick MR layer that needs a large current for operation.

The exchange coupling between the first and second magnetic layers 5a and 5b refers to a coupling caused by an exchange interaction between the layers 5a and 5b disposed adjacent to each other such that the direction of magnetization of the first magnetic layer 5a having a small coercive force is determined by the influence of the magnetization of the second magnetic layer 5b having a large coercive force. There are two kinds of the exchange coupling. The first is the ferromagnetic exchange coupling which is an interaction of lowering the energy of the whole system when the electron spins which determine the respective magnetisms of the adjacent two magnetic layers sandwiching the nonmagnetic layer are parallel. The second is the antiferromagnetic exchange coupling which is an interaction of lowering the energy of the whole system when the respective electron spins of the adjacent magnetic layers are antiparallel.

The present invention utilizes a larger MR effect such that the resistance is markedly increased when the parallel directions of magnetization of the exchange coupled MR layers change to the antiparallel state, while in contrast the resistance is markedly decreased when the antiparallel directions of magnetization of the exchange coupled MR layers change to the parallel state. The larger MR effect is such a phenomenon that the resistance is subject to whether the relative directions of magnetization of the adjacent magnetic layers interposing the nonmagnetic layer are parallel or antiparallel to each other, and does not depend on the direction of magnetization and of current unlike the anisotropic MR effect. In addition, a change in resistance due to the larger MR effect is markedly large as compared with that due to the anisotropic MR effect. With the memory element of the present embodiment, for example, there is a large difference between the resistivity $\rho_0$ when the respective directions of the first and second magnetic layers are parallel and the resistivity $\rho_1$ when they are antiparallel, and the rate of change in resistivity $(\rho_1-\rho_0)/\rho_0$ is 10% in the ferromagnetic exchange coupling while 20% in the antiferromagnetic exchange coupling. Accordingly, the combination of the magnetic layers and nonmagnetic layer is a very important factor for determining the rate of change in resistivity $(\rho_1-\rho_0)/\rho_0$. According to this formula, when $\rho_0$ decreases, the rate of change in resistivity increases, hence, a smaller $\rho_0$ is preferable. For this reason the magnetic layers and nonmagnetic layer each should be composed of a good conductor having a resistivity of, for example, at most about $10^{-4}\ \Omega$ cm at room temperature.

A magnetic thin film memory is constructed by arranging magnetic thin film memory elements of the type described above in a matrix pattern and connecting the memory elements in rows to each other with sense lines 21 to 23 and those in columns to each other with word lines 31 to 33 as shown in, for example, FIG. 2. The MR layer 5 has an easy magnetic axis with which the direction of magnetization is easy to align. Although the easy magnetic axis of each memory element may be aligned with either the direction of the sense line or that of the word line, it is made to align with the direction of the sense line in the present embodiment.

It is preferable to make the easy magnetic axis of each memory element substantially parallel to the direction of the sense line because the coercive force of the magnetic layers is decreased thereby, hence, the current required for recording or reproduction can be decreased. In the embodiment shown in FIG. 2, although the word lines cross the sense lines at right angles, they may cross the sense lines at any angle. However, it is preferable that the easy magnetic axis is substantially perpendicular to the word line since if so, a magnetic field produced by the word line can be effectively utilized thereby to decrease the consumed electric power consumption.

Figure 12:
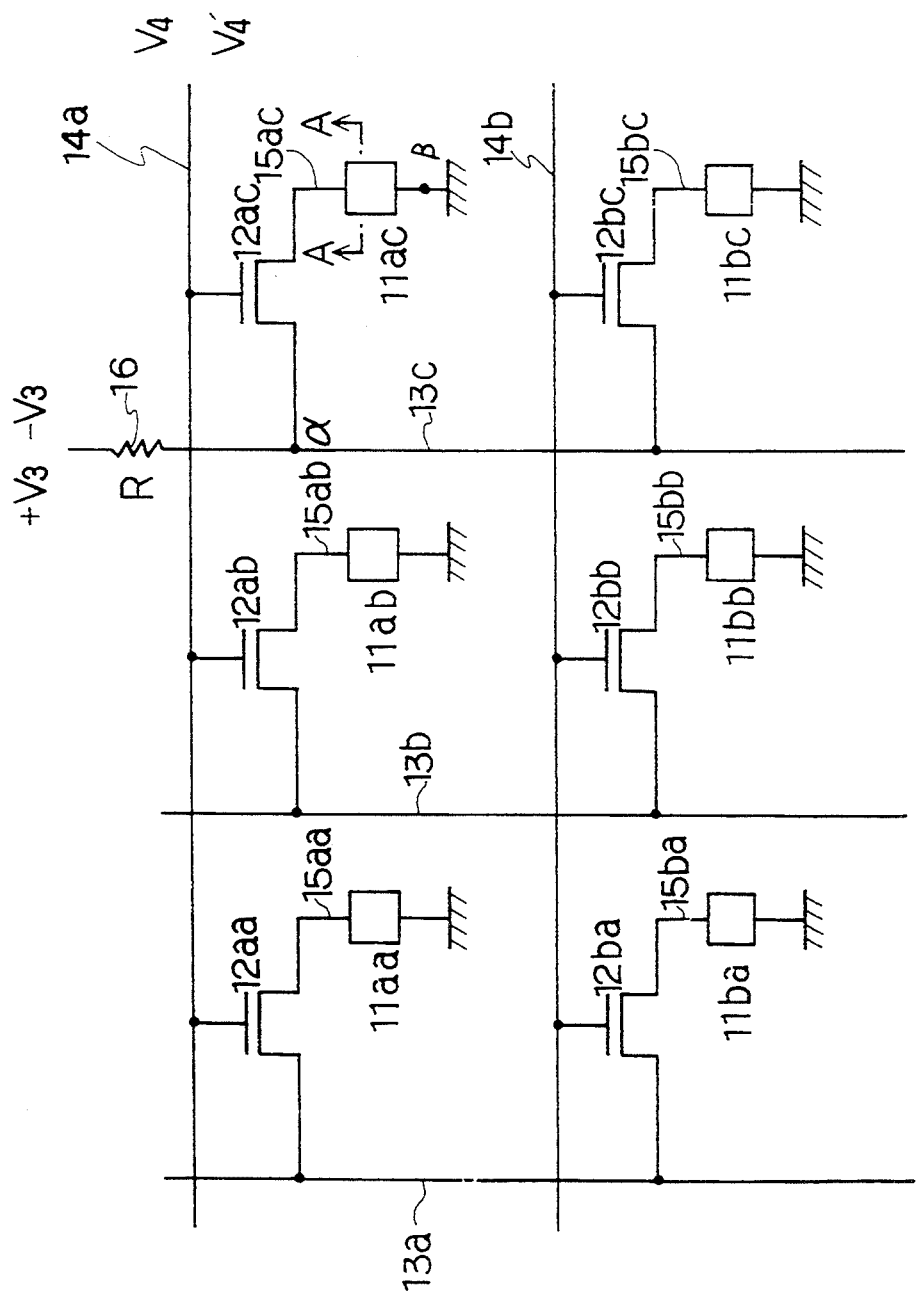
FIG. 12 is an explanatory view schematically illustrating an embodiment of a magnetic thin film memory according to the present invention.

FIG. 12 is an explanatory view showing an embodiment of a magnetic thin film memory using a switching element of the present invention. In FIG. 12, numeral 11 denotes a magnetic thin film memory element. Although suffix (11aa, 11ab, ... 11bb) is given to memory elements to specify the address thereof, numeral 11 is used to generally denote a magnetic thin film memory element when particular descrimination among memory elements is unnecessary. This holds true for other reference characters. Numeral 12 (12as, 12ab, 12ac, 12ba, 12bb and 12bc) denotes a switching element, for example, a FET. Numerals 13 (13a, 13b and 13c) and 15 (15aa, 15ab, 15ac, 15ba, 15bb and 15bc) each denote a data line. Numerals 14 (14a and 14b) and 16 denote a sense line and a resistor, respectively. The voltage across the opposite ends $\alpha$ and $\beta$ of the magnetic thin film memory element 1ac is denoted by a V $\alpha$ $\beta$. As shown in FIG. 12, on a substrate are provided the sense line 14 extending sidewardly and the data line 13 extending vertically. The gate electrode of a FET as the switching element is connected with the sense line 14, while the source/drain electrodes thereof are connected between the data lines 13 and 15. The data line 15 is disposed just under or over the magnetic thin film memory element so in as to be in direct contact therewith, and is connected to ground at the other end.

As the magnetic thin film memory element 11, a magnetic thin film is used in which a magnetic layer a having a large coercive force, magnetic layer b having a small coercive force and nonmagnetic layer c are stacked in the sequence of a/c/b/c/a/c/b/c . . . with the nonmagnetic layer c interposed between the magnetic layers a and b and vice versa. In the present embodiment, it does not matter whether there is an exchange coupling between the magnetic layer a and the magnetic layer b or not.

The magnetic layer a having a large coercive force is formed of, for example, an alloy layer such as made of NiCoPt, NiCoTa, NiCoCr, NiCoZr or NiCo. A magnetic field strength at which magnetization of the magnetic layer a begins to inverse is preferably larger than a magnetic field strength at which magnetization of the magnetic layer b is saturated. The thickness of the magnetic layer a is preferably 10 to 50 Å. The magnetic layer b having a small coercive force is formed of, for example, an alloy film such as made of NiFe or NiFeCo. In the case of the NiFe alloy film, the contents of Ni and Fe are preferably 75 to 85% and 15 to 25%, respectively.

The coercive force of the magnetic layer b is preferably 0.5 to 5 Oe, and the thickness thereof is preferably 10 to 50 Å. The nonmagnetic layer c is made of, for example, Cu, Cr, V, W, Al, or Al-Ta, and the thickness thereof is preferably 20 to 100 Å. Thickness of a (a/c/b/c) layer is preferably in the range of 40 to 200 Å, and is repeatedly stacked preferably 5 to 30 times, more preferably 10 to 20 times. Thickness of the magnetic thin film formed by repeatedly stacking the (a/c/b/c) layer is preferably in the range of 500 to 3000 Å in total, and the size thereof is preferably about 0.5 to about 1.5 $\mu$m by about 0.5 to about 1.5 $\mu$m.

The aforesaid magnetic thin film can be formed on an insulating substrate such as a Si substrate covered with an insulating film of, for example, $SiO_2$ or $SiN_x$ (x=1 to 1.33) by sputtering, MBE (Molecular Beam Epitaxy), ultrahigh vacuum evaporation, electron beam evaporation method, vacuum evaporation method or the like. DC magnetron sputtering method are preferred sputtering methods and RF sputtering method in view of their relatively easy power control.

To be described next is a recording/reproduction method by way of a ferromagnetic exchange coupled memory, antiferromagnetic exchange coupled memory, and a memory provided with a switching element.

EXAMPLE 1

A magnetic thin film memory was used in which an MR layer 5 was made by stacking ten sequences of first magnetic layer 5a (35 Å thick)/nonmagnetic layer 5c (35 Å thick)/second magnetic layer 5b (50 Å thick)/nonmagnetic layer 5c (35 Å thick). The first magnetic layer 5a was formed of $Ni_{80}Fe_{20}$, the second magnetic layer of $Ni_{80}Fe_{15}Co_5$, and the nonmagnetic layer 5c of Cu. Both the first magnetic layer 5a and the second magnetic layer 5b have a strong magnetic anisotropy and easy magnetic axes thereof were made to orient parallel to the sense line. Eight memory elements were connected to each other in series with one sense line.

Figure 3A:
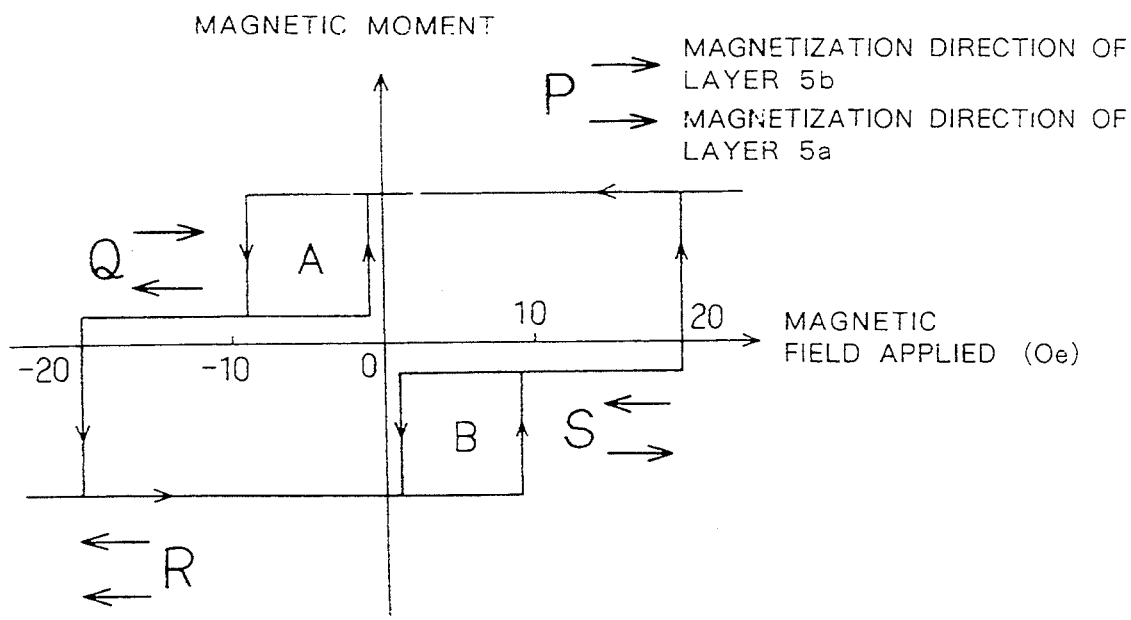
FIG. 3(a) is a diagram showing a magnetization loop (VSM loop) of a ferromagnetically-coupled MR layer of Example 1.

FIG. 3(a) shows the magnetization loop (VSM loop) of the MR layer 5 of each memory element. The measurement was conducted under application of a magnetic field along the easy magnetic axis. In FIG. 3(a), a hysteresis curve is shown with the horizontal axis representing a magnetic field applied and the vertical axis representing a magnetic moment. In the present Example, since the first magnetic layer 5a having a small coercive force and the second magnetic layer 5b having a large coercive force are coupled by exchange interaction through the nonmagnetic layer 5c, the direction of magnetization of the first magnetic layer 5a having a small coercive force is inversed with a delay due to the influence of the second magnetic layer. In detail, the direction of magnetization of the second magnetic layer having a coercive force of about 20 Oe orients rightward (that the first magnetic layer 5a having a small coercive force orients rightward), hence, the respective directions of magnetization of the two magnetic layers are aligned with each other in the rightward direction, which is a recording state of "0" (indicated by reference character P in FIG. 3). Even when, from this state, the magnetic field applied decreases to 0, the recording state is retained. Further, when a negative magnetic field (the direction thereof is reversed) is increasingly applied, the direction of magnetization of the first magnetic layer 5a is reversed at a magnetic field of less than about −9 Oe (i.e. larger in absolute value), hence, the respective directions of magnetization of the two magnetic layers oriented antiparallel to each other, or in the opposite directions (the state indicated by reference character Q in FIG. 3). Since the coercive force of the first magnetic layer 5a is about 4 Oe, the magnetization thereof would inherently be reversed at −4 Oe. However, because the first magnetic layer was ferromagnetically. exchange-coupled with the second magnetic layer, a magnetic field, at which the direction of magnetization was reversed, was shifted by about 5 Oe. If the magnetic field applied was subsequently increased (decreasing the absolute value), the antiparallel state was retained until the magnetic field increased up to −1 Oe due to the hysteresis of the first magnetic layer 5a, thereby drawing a small loop A. When the magnetic field was further increased in the negative direction, the direction of magnetization of the second magnetic layer 5b was also reversed at less than −20 Oe (larger in absolute value). Accordingly, the respective direction of magnetization of both the two layers is oriented parallel in the leftward direction, which is a recording state of "1" (indicated by reference character R in FIG. 3). From this state, as the magnetic field is increased to the positive (+) side, the state R was retained even when the magnetic field applied was 0 because of the hysteresis of the magnetic layers, and the magnetization of the first magnetic layer 5a was reversed when the magnetic field applied was 9 Oe. Since the magnetization of the second magnetic layer 5b was not reversed yet, the direction of magnetization of the first magnetic layer 5a oriented rightward while that of the second magnetic layer 5b oriented leftward, hence, such a state as to be indicated by reference character S in FIG. 3 occurs. In this state S, if the magnetic field applied decreases, a small loop B like the loop A described above will be drawn. As the magnetic field is further increased, the magnetization of the second magnetic layer 5b is reversed when the magnetic field is 20 Oe or larger, whereby the initial recording state "0" indicated by P is resumed.

Figure 3B:
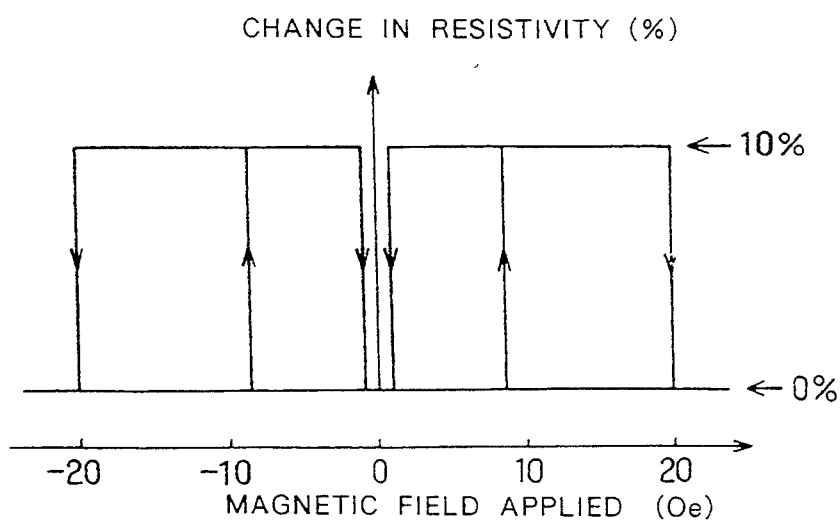
FIG. 3(b) is also a diagram showing an MR loop.

As described above, the resistance of the MR layer is increased when the respective direction of magnetization of the two magnetic layers 5a and 5b are antiparallel, as shown in FIG. 3(b). As seen from FIG. 3(b), in the case of the recording state "1" (indicated by R in FIG. 3(a)), as a positive magnetic field increases, the resistance increases when the magnetic field applied is 9 Oe and the increased resistance decreases to the original value when the magnetic field applied is 20 Oe or larger. When the magnetic field in the range of from 9 Oe or larger to smaller than 20 Oe was decreased to a value smaller than 9 Oe, the resistance resumed its initial value at 1 Oe (refer to the small loop B in FIG. 3(a)). In the case of the recording state "0", as a negative magnetic field was increasingly applied, the resistance increased at −9 Oe or smaller (larger in absolute value) and the increased resistance resumed its initial value at −20 Oe or smaller (larger in absolute value). Therefore, it can be understood that the recording state was "1" if a change in the resistance of the MR layer occurred when a magnetic field of, for example, 9 to 20 Oe was applied, and the recording state was "0" if such a change did not occur under the same condition.

The recording/reproduction method for such a magnetic thin film memory is as follows:

When a random access recording, for example, is effected on a memory element 511 of the magnetic thin film memory shown in FIG. 2, current is made to flow through both the sense line 21 and the word line 31. The word current for recording flowing through the word line 31 produces a magnetic field by word current for recording of about 16 Oe, which orients leftward or rightward, at a location of the memory element 511. The orientation, leftward or rightward, of such a magnetic field depends on whether the direction of the word current for recording is upward (leftward) or downward (rightward) in the drawing. On the other hand, the sense current for recording flowing through the sense line 21 produces a magnetic field by sense current for recording of about 8 Oe, which orients upward or rightward, at the location of the memory element 511. Unlike the word current, the sense current may always flow in one direction. For example, it is made to flow so that the magnetic field produced by sense current for recording would orient upward.

FIG. 4 shows a change in the magnetization state of the MR layer 5 when the memory element 511 is applied with magnetic field produced by sense current for recording and recording word magnetic field.

Figure 4A:
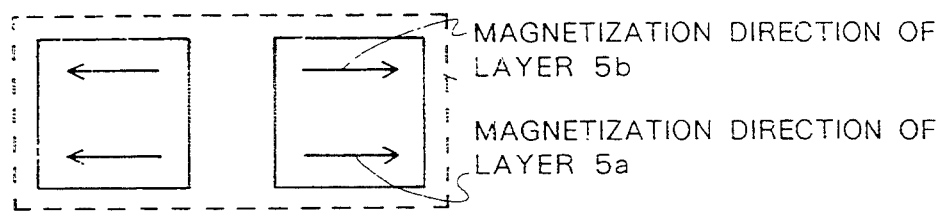
FIGS. 4(a)-4(g), are explanatory views showing a change in the magnetization state of the ferromagnetically-coupled MR layer of Example 1 in recording.
Figure 4B:
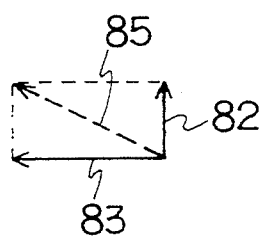
Figure 4E:
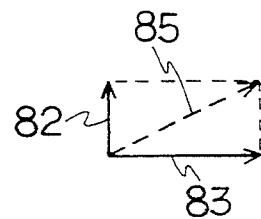
Figure 4C:
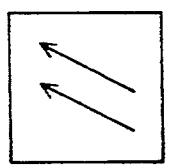
Figure 4F:
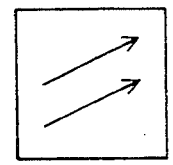
Figure 4D:
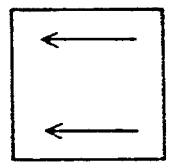
Figure 4G:
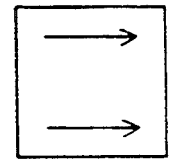
Figure 5A:
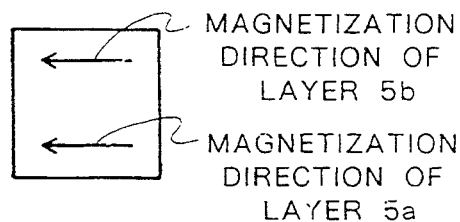
FIGS. 5(a)-5(g) are explanatory views showing a change in the magnetization state of the ferromagnetically-coupled MR layer of Example 1 in reproduction.
Figure 5E:
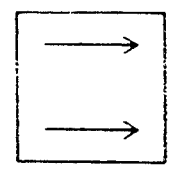
Figure 5B:
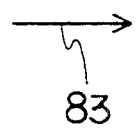
Figure 5C:
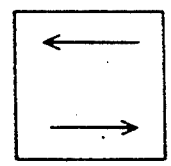
Figure 5F:
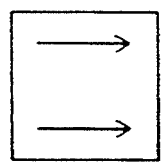
Figure 5D:
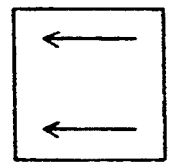
Figure 5G:
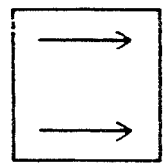

In the present Example, since the first and second magnetic layers 5a and 5b are ferromagnetically coupled by exchange interaction with each other, the respective directions of magnetization thereof are aligned in the same direction. The magnetization state, leftward or rightward, before application of a magnetic field (FIG. 4(a)) has nothing to do with the subsequent recording procedure. If the word magnetic field produced by word current for recording orients leftward as shown in FIG. 4(b), a composite magnetic field composed of the magnetic field 82 produced by sense current for recording and recording word magnetic field 83 orients in the upper-left direction. At this time the respective directions of magnetization of the first and second magnetic layers 5a and 5b are also aligned in the upper-left direction (FIG. 4(c)). When is the magnetic field is eliminated (current is stopped), the respective directions of magnetization of the two magnetic layers 5a and 5b orient leftward to align with the easy magnetic axis, which is a stable state. Thus, information "0" is recorded (FIG.-4(d)). Alternatively, if the magnetic field produced by word current for recording orients rightward, the composite magnetic field composed of the recording sense magnetic field 82 produced by sense current for recording and the recording in word magnetic field 83 orients the right-upper direction as shown in FIG. 4(e). At this time the respective directions of magnetization of the first and second magnetic layers 5a and 5b are also aligned in the upper-right direction (FIG. 4(f)). When the magnetic field is eliminated, the respective directions of magnetization of the two magnetic layers 5a and 5b orient rightward and assume a stable state. Thus, information "0" is recorded (FIG. 4(g)). By rotating the direction of the word current for recording depending on 2-bit information as described above, the magnetization state, leftward (corresponding to, for example, "1") or rightward (corresponding to, for example, "0"), can be recorded. That is, the direction of magnetization to be recorded is substantially parallel to the sense line, whereby the coercive force of the magnetic layer is decreased, hence, current needed for recording can be reduced. Further, by making the direction of magnetization substantially perpendicular to the word line, the word magnetic field produced by word current for recording can be effectively utilized. Although there are, besides the memory element 511, memory elements applied with a magnetic field in the magnetic thin film memory shown in FIG. 2, these are applied with only one of the magnetic field produced by sense current for recording and word magnetic field produced by sense current for recording. Hence, the intensity of the magnetic field applied is insufficient to reverse the magnetization. Although the magnetization of such memory elements is possible to be inclined slightly upon application of a magnetic field, the initial recording state is resumed when the magnetic field is eliminated. Thus described is the principle of the recording method.

The principle of the reproduction method is as follows:

When a random access reproduction, for example, is to be conducted on the memory element 511, current is made to flow through both the sense line 21 and the word line 31. In this case the reproduction sense current flowing through the sense line 21 and the reproduction word current flowing through the word line 31 produce a magnetic field by sense current for reproduction and a reproduction word magnetic field, respectively at a location of the memory element 511. Since the sense current for reproduction is set sufficiently small, the sense magnetic for reproduction field produced thereby is so small that it does not matter. Further, since the reproduction sense magnetic field is also set sufficiently small, as small as about 10 Oe, as compared with the composite magnetic field composed of the sense magnetic field produced by sense current for recording and magnetic field produced by word current for recording, recorded information will never be destroyed. That is, even when the magnetization of the first magnetic layer 5a is reversed, the magnetization of the second magnetic layer 5b will never be reversed, hence, recorded information will never be destroyed as described below.

The procedure of reproduction by these magnetic fields is described by way of FIG. 5. As shown in FIG. 5, the magnetic field 83 produced by word current for reproduction is set to orient rightward (refer to FIG. 5(b)). With respect to a leftward recording state (refer to FIG. 5(a)) the magnetization of the first magnetic field is reversed rightwardly (refer to FIG. 5(c)). Monitoring the voltage across the opposite ends of the sense line makes it possible to find a change in the resistance since a change in voltage is proportional to a change in resistance. When the magnetic field produced by word current for reproduction is eliminated, the magnetization of the first magnetic field 5a is resumed to orient leftward due to the exchange coupling force from the second magnetic layer 5b. Hence, the respective directions of magnetization of the first and second magnetic layers are aligned parallel in the leftward direction (refer to FIG. 5(d)). On the other hand, with respect to a rightward recording state (refer to FIG. 5(e)) the magnetization state is the state indicated by P in FIG. 3 and the magnetization will never be reversed (refer to FIG. 5(f). Hence, as a matter of course a change in voltage is not detected on the sense line. Thus, a large change in voltage occurs with respect only to the leftward magnetization, telling whether the recorded information is "0" or "1". Although a plurality of memory elements are connected to each other in series with the sense line, these memory elements other than the memory element 511 are not applied with the magnetic field produced by word current for reproduction. Therefore, a change in the resistance thereof does not occur, and those memory elements will not contribute to the reproduction. In other words information is reproduced only from the memory element 511 selectively. Thus described is the principle of the reproduction method.

Although in the above Example 1 the magnetic field produced by word current for reproduction is about 10 Oe, a large change in voltage occurs when the magnetic field produced by word current for reproduction is from about 9 Oe to about 20 Oe as shown in FIG. 6 showing the results of measurement on a change in voltage across the sense line with varying word current for reproduction (i.e., word magnetic field produced by word current for reproduction). As apparent from FIG. 3, this is because a change in resistance occurs when the magnetization of only the first magnetic layer 5a is reversed with that of the second magnetic layer 5b remaining unreversed with the result that the respective directions of magnetization of the adjacent magnetic layers become antiparallel to each other. Accordingly, in general the reproduction word current is set so that the reproduction word magnetic field produced thereby would meet the following condition: magnetic field reversing the magnetization of the first magnetic layer 5a < reproduction word magnetic field < magnetic field reversing the magnetization of the second magnetic layer 5b.

EXAMPLE 2

As aforementioned, it is known that the adjacent magnetic layers are coupled by exchange interaction with each other either ferromagnetically or antiferromagnetically depending on the thickness of the nonmagnetic layer. Although in Example 1 the adjacent magnetic layers were ferromagnetically coupled by exchange interaction, they were antiferromagnetically coupled by exchange interaction in the present Example.

A memory element of the same constitution as that in Example 1 was constructed except that the thickness of the nonmagnetic layer (Cu) was varied to 25 Å. Specifically, an MR layer comprised stacked 10 sequences of first magnetic layer (35 Å thick)/nonmagnetic layer (25 Å thick)/second magnetic layer (50 Å thick)/nonmagnetic layer (25 Å thick). The first magnetic layer was formed of $Ni_{80}Fe_{20}$, the second magnetic layer of $Ni_{80}Fe_{15}Co_{5}$, and the nonmagnetic layer of Cu. Further, the respective easy magnetic axes of the first and second magnetic layers were made parallel to the sense line.

Eight memory elements were connected to each other in series with one sense line.

With the MR layer used in this Example, the relation between the resistivity $\rho$ o appearing when the respective directions of magnetization of the first and second magnetic layers were parallel and the resistivity $\rho$ 1 appearing when they were antiparallel was as follows:

$$(\rho_1 - \rho_o)/\rho_o = 0.2$$

As can be understood from the above equation, by making the nonmagnetic layer of Cu thin the magnetic layers were antiferromagnetically coupled by exchange interaction, hence, an MR efficiency of 20% was obtained which was large as compared with the MR layer in Example 1.

Figure 7A:
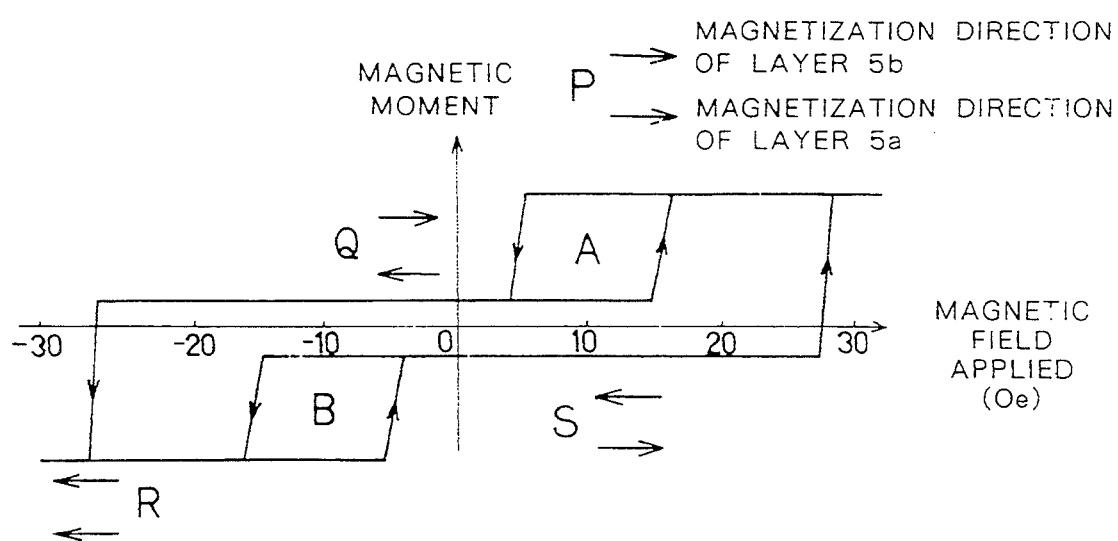
FIG. 7(a) is a diagram showing a magnetization loop (VSM loop) of an antiferromagnetically-coupled MR layer of Example 2.
Figure 7B:
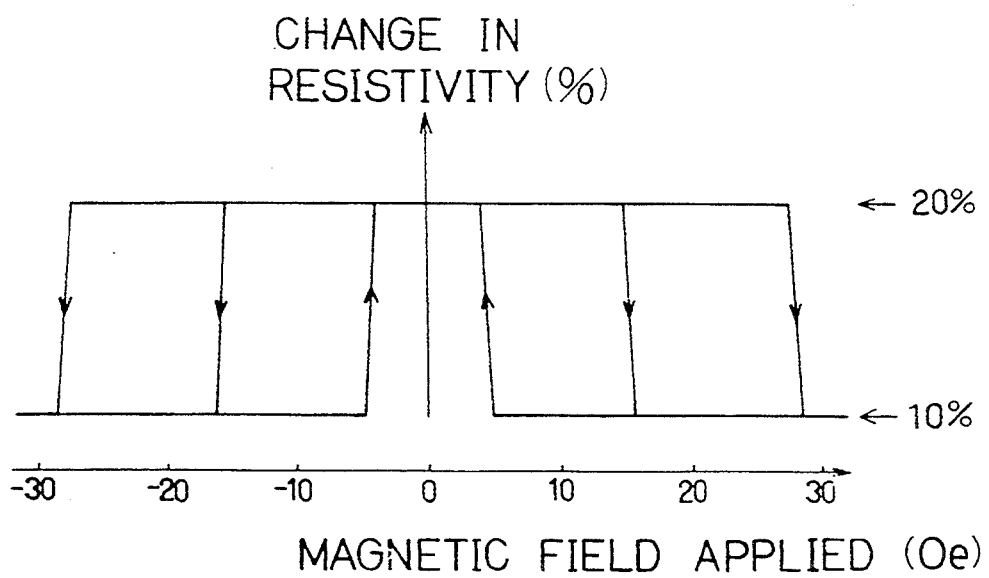
FIG. 7(b) is also a diagram showing an MR loop.
Figure 8A:
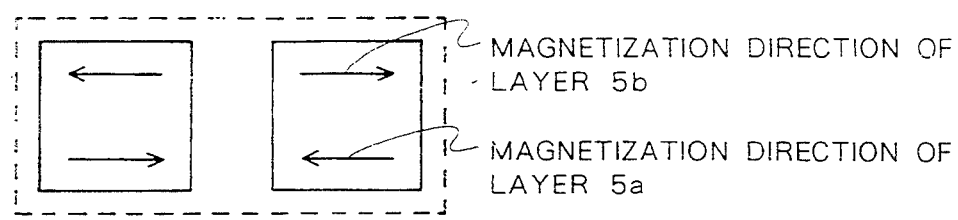
FIG. 8(a)-8(g) are explanatory views showing a change in the magnetization state of the antiferromagnetically-coupled MR layer of Example 2 in recording.
Figure 8B:
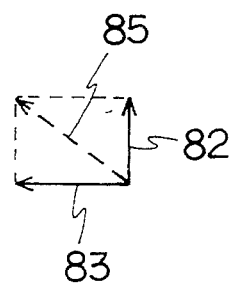
Figure 8E:
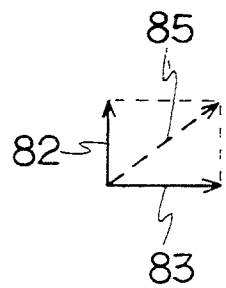
Figure 8C:
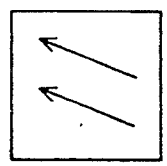
Figure 8F:
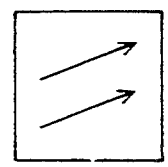
Figure 8D:
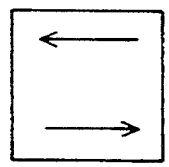
Figure 8G:
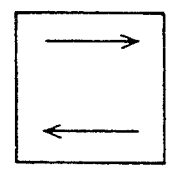
Figure 9A:
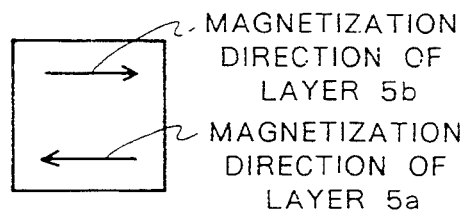
FIG. 9(a)-9(g) are explanatory views showing a change in the magnetization state of the antiferromagnetically-coupled MR layer of Example 2 in reproduction.
Figure 9E:
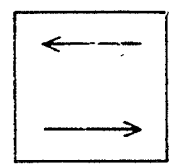
Figure 9B:
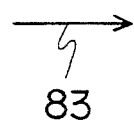
Figure 9C:
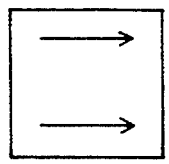
Figure 9F:
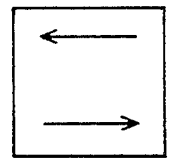
Figure 9D:
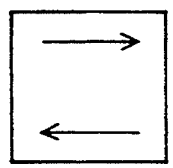
Figure 9G:
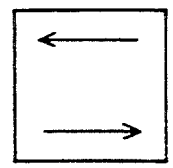

FIG. 7 shows the magnetization loop (VSM loop) and MR loop of this multilayer film. In FIG. 7, although similar to FIG. 3 in Example 1, a small loop A representing the hysteresis of the first magnetic layer 5a is shifted by about 10 Oe in the positive (+) direction. That is, the small loop A was formed in the range of 5 to 15 Oe. The magnetization of the second magnetic layer 5b is reversed at about 28 Oe. The MR loop shown in FIG. 7(b) is measured with a magnetic field applied along the easy magnetic axis. Unlike Example 1, the respective directions of magnetization of the first and second magnetic layers 5a and 5b were antiparallel when the magnetic field was 0. Accordingly, information "1" was recorded when the magnetization of the first magnetic layer 5a oriented rightward and that of the second magnetic layer 5b oriented leftward. In contrast information "0" was recorded when the magnetization of the first magnetic layer 5a oriented leftward and that of the second magnetic layer 5b oriented rightward.

The recording method for such an antiferromagnetically exchange coupled magnetic thin film memory is as follows.

When a random access recording, for example, is to be conducted on the memory element 511 shown in FIG. 2, current is made flow through both the word line 31 and the sense line 21. The word current flowing through the word line 31 produces a magnetic field by word current for recording of about 23 Oe orienting leftward or rightward at the memory element 511. The direction of the magnetic field produced by word current for recording, leftward or rightward, depends on the direction of the recording current for recording, upward or downward. The recording sense current flowing through the sense line 21 produces a recording magnetic field by sense current for of about 12 Oe orienting upward or downward at the memory element 511. Unlike the word current, the sense current may flow in only one fixed direction. For example, the direction of the sense current is determined so that the magnetic field produced by sense current for recording would orient upward. FIG. 8 shows a change in the magnetization state of the MR layer when the memory element is applied with the magnetic field produced by sense and word current for recording.

In FIG. 8, the direction, leftward or rightward of magnetization of the second magnetic layer 5b (indicated by upper arrow in FIG. 8), before application of a magnetic field has nothing to do with the subsequent recording procedure. Note that due to antiferromagnetic coupling, the magnetization of the first magnetic layer orients in the opposite direction to that of the second magnetic layer. When the magnetic field 83 produced by word current for recording orients leftward, a composite magnetic field 85 composed of the magnetic field 82, 83 produced by sense and word current for recording orients in the upper-left direction as shown in FIG. 8(b). At this time the respective directions of magnetization of the first and second magnetic layers 5a and 5b are also aligned in the upper-left direction (refer to FIG. 8(c)). When the magnetic field is then eliminated (current is stopped), the magnetization of the second magnetic field 5b is aligned with the easy magnetic axis in the leftward direction, and that of the first magnetic layer 5a having a small coercive force orients rightward due to antiferromagnetic exchange coupling (refer to FIG. 8(d)). This is a stable magnetization state. On the other hand, when the magnetic field produced by word current for recording orients rightward, the composite magnetic field composed of the magnetic field produced by sense and word current for recording and the recording word magnetic field orients in the upper-right direction as shown in FIG. 8(e). At this time the respective direction of magnetization of the two magnetic layers 5a and 5b are also aligned in the upper-right direction (refer to FIG. 8(f)). When the magnetic field is then eliminated, the magnetization of the first magnetic layer 5a orients leftward to assume its stable state due to antiferromagnetic exchange coupling (refer to FIG. 8(g)). Thus, by changing the direction of the word current for recording in accordance with 2-bit information to be recorded, the direction, leftward or rightward, of the second magnetic layer 5b can be recorded. As in Example 1, it is preferable that the direction of magnetization to be recorded is substantially parallel to the sense line and substantially perpendicular to the word line. Although there are memory elements applied with a magnetic field besides the memory element 511, these are applied with only one of the magnetic field produced by sense and word current for recording. This is insufficient to reverse the magnetization. Therefore, although the magnetization may be inclined slightly, the magnetization resumes its initial recording state upon elimination of the magnetic field. Thus described is the principle of the recording method.

To be described next is a reproduction method. When, for example, a random access reproduction is to be conducted on the memory element 511 shown in FIG. 2, current is made to flow through the sense line 21 and the word line 31. At this time the reproduction sense current flowing through the sense line 21 and the reproduction word current flowing through the word line 31 produce a reproduction sense magnetic field and a reproduction word magnetic field, respectively at the memory element 511. The reproduction word magnetic field in this case is so small that it does not matter. Further, since the reproduction word magnetic field is set smaller, as small as about 10 Oe, than the composite magnetic field composed of the magnetic field produced by sense and word current for recording, recorded information will never be destroyed.

The reproduction procedure based on these magnetic fields is described by way of FIG. 9. As shown in FIG. 9, the reproduction word magnetic field 83 is adapted to orient rightward (refer to FIG. 9(b)). In the case where the leftwardly-orienting magnetization of the first magnetic layer 5a has been recorded (refer to FIG. 9(a)), the magnetization of the first magnetic layer 5a is reversed to orient rightward and parallel to that of the second magnetic layer 5b (FIG. 9(c)). By monitoring the voltage across the sense line, a change in resistance can be detected since the a change in voltage is proportional to a change in resistance. As apparent from FIG. 7, when the reproduction word magnetic field is then eliminated, the magnetization of the first magnetic layer 5a resumes its original state or orients leftward because of antiferromagnetic exchange coupling (refer to FIG. 9(d)). On the other hand, in the case where the rightwardly-orienting magnetization of the first magnetic layer 5a has been recorded (refer to FIG. 9(e)), such magnetization will not be reversed (refer to FIG. 9(f)) and, as a matter of course, a change in voltage is not detected. Thus, a large change in voltage occurs only when the magnetization of the first magnetic layer is in the leftward direction, thereby telling whether the recorded information is "0" or "1". Although a plurality of memory elements are connected to each other with the sense line, the memory elements other than the memory element 511 are not applied with the reproduction word magnetic field, hence, they exhibit no change in resistance and no contribution to reproduction. That is, the recorded information is reproduced only from the memory element 511 selectively. Thus described is the principle of the reproduction method.

Figure 10:
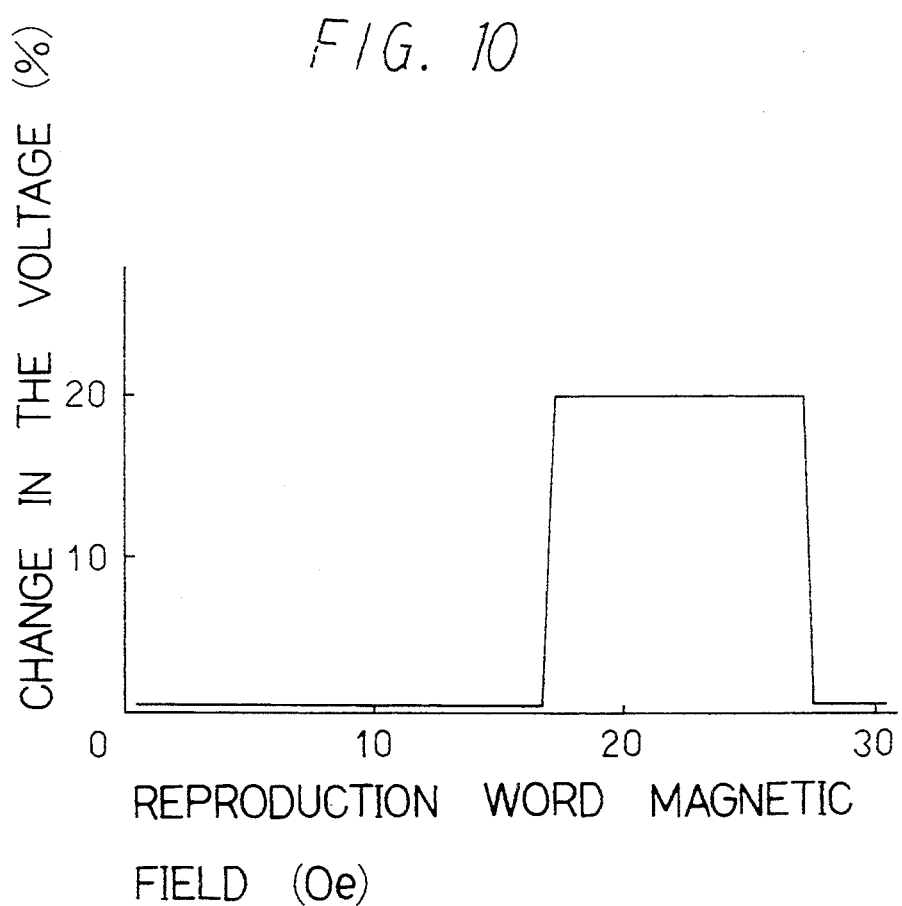
FIG. 10 is a diagram showing a change in the voltage of the antiferromagnetically-coupled MR layer of Example 2 upon application of a reproduction word magnetic field.

Although the reproduction magnetic field produced by word current was about 10 Oe in the above Example 2, a large change in voltage was detected when the reproduction word magnetic field was in the range from about 17 Oe to about 28 Oe, as can be understood from FIG. 10 showing the results of measurement on a change in voltage across the sense line with varying reproduction word current (reproduction word magnetic field). As apparent from FIG. 7, this is because a change in resistance occurs when the magnetization of only the first magnetic layer 5a is reversed with that of the second magnetic layer remaining unreversed with the result that the respective directions of magnetization of the adjacent magnetic layers become parallel to each other. Therefore, in general the reproduction current is set so that the reproduction word magnetic field produced by word current would meet the following condition: magnetic field reversing the magnetization of the first magnetic layer 5a < reproduction word magnetic field < magnetic field reversing the magnetization of the second magnetic layer 5b.

EXAMPLE 3

Figure 11A:
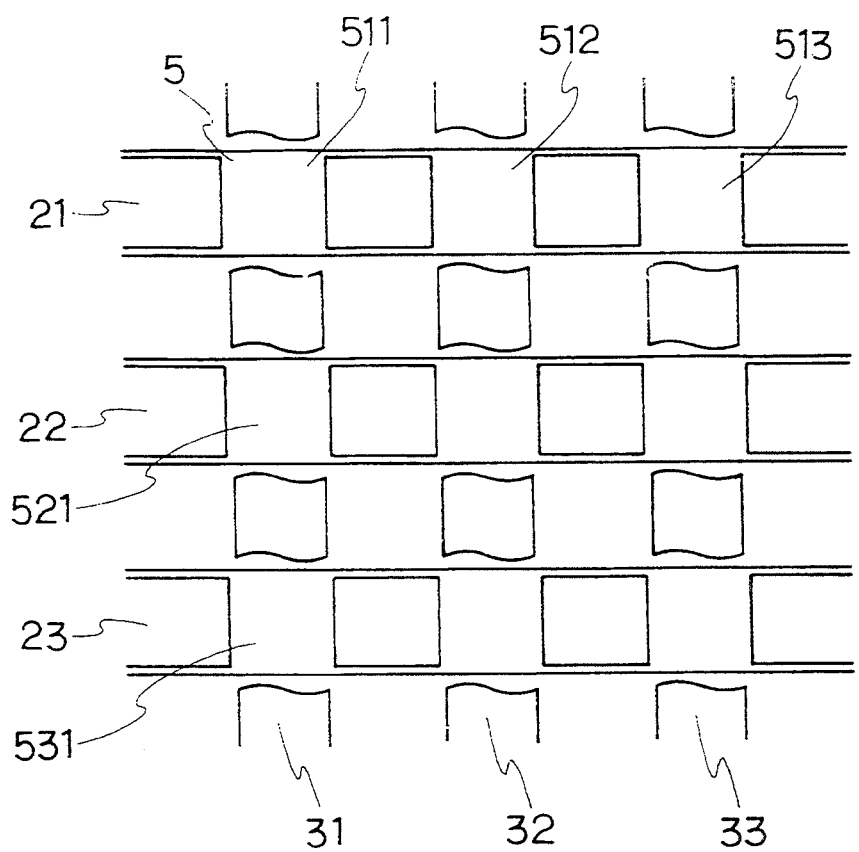
FIG. 11(a) is a plan view showing the structure of another embodiment of a magnetic thin film memory utilizing exchange coupling according to the present invention.
Figure 11B:
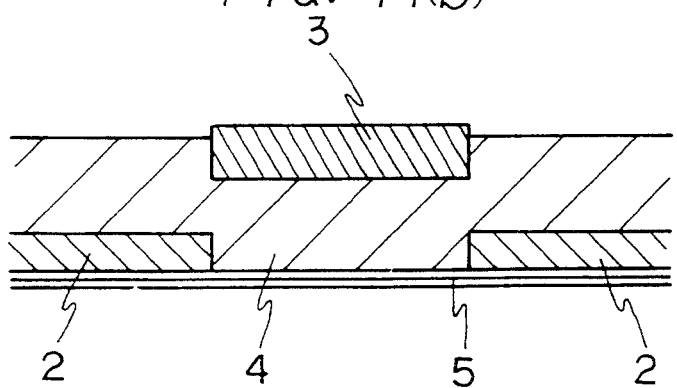
FIG. 11(b) is a schematic sectional view showing a memory element of the magnetic thin film memory.

FIG. 11 shows the structure of another embodiment of a magnetic thin film memory according to the present invention. In the present Example, the MR layer 5 forming a memory element was not patterned to a square shape only in the memory element part but to a strip shaped. As seen from FIG. 11(b) showing a memory element of this memory in section, a sense line 2 arranged between adjacent memory elements was formed of a good conductor having a larger conductance than the MR layer 5 and a conductor having a large thickness. Hence, in the portion adjacent the sense line 2, most of current flew through the sense line 2 having a lower resistance than that portion. Since the resistance of the sense line 2 will never be increased, the magnetic thin film memory in this Example exhibits characteristics equivalent to those of the memory having square memory elements. Further, the magnetic thin film memory employing such a structure offers such advantages in fabrication that connection between the sense line and the MR layer can be achieved with ease and a difference in height which would hinder the connecting operation is not produced.

EXAMPLE 4

Next, the method for recording and the reproduction method of the magnetic thin film provided with the above-mentioned magnetic thin film and the switching element will be explained.

Firstly, the directions of magnetization in the magnetic layer $\underline{a}$ and $\underline{b}$ are previously made to orient in the same direction, for example, to the right in the drawing by, for example, applying a large magnetic field in a direction in the plane of the magnetic thin film before conducting a magnetic shielding with respect to the memory element 11.

Secondly, the recording method is to be described. Recording is accomplished by causing the direction of magnetization of each magnetic thin film memory element to orient in a specified direction. Since the direction of magnetization of the magnetic layer $\underline{b}$ associated with recording is in the plane of the memory element, it is herein assumed that a direction ( for example, to the left in the drawing) perpendicular to the direction of current flowing through the data line corresponds to "1" while the direction (to the right in the drawing) opposite to the former corresponds to "0" whereby the two directions represent binary digit information.

Figure 13:
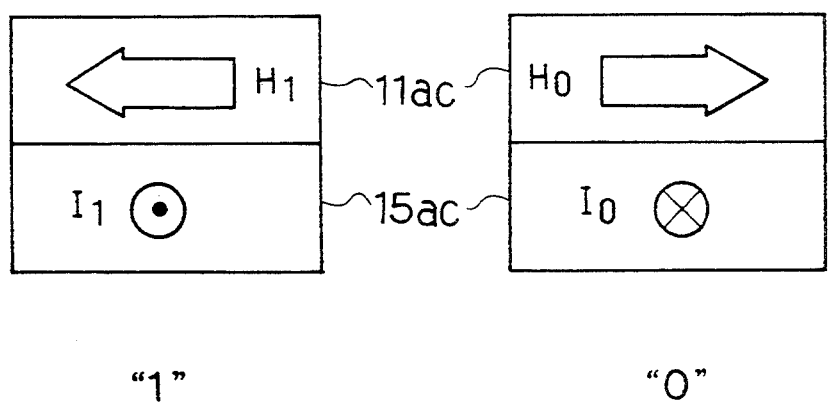
FIG. 13 is an explanatory view for showing the direction of a current flow in a wire under a magnetic thin film memory element lac and a direction of a magnetic field generated by the current flow.

With reference to FIGS. 12 and 13, described is the case where information "1" is to be recorded in, for example, the memory element 11ac, i.e., where the direction of magnetization is to be made to orient to the left in the drawing.

In FIG. 12, when recording is not effected, current is absent in lines 13a, 13b, 13c, 14a and 14b. The data line 13c is applied with a voltage $+V3$ in recording information "1" in the magnetic thin film memory element 11ac. At that time, application of a voltage $V_4$ to the sense line 14a causes the switching element 12ac to be switched to the conductive state, with the result that a relatively large current $I_1$ flows in the memory element 11ac and data line 15ac. The switching element 12 is adapted to be switched to the conductive state only when an appropriate voltage is applied to the sense line 14. Hence, current does not flow in other memory elements associated with the data line 13c. Current does not flow in other memory elements associated with the sense line 14a since current is absent in data lines other than the data line 13c. The state of current in this case is shown in FIG. 12. FIG. 13 is a sectional view taken along a line A—A of FIG. 12, and the reference characters therein correspond to those in FIG. 12. Numeral 15ac denotes a wire provided just under the magnetic thin film. As shown in FIG. 13, by the current $I_1$ which flows from the back side of the drawing to the front side thereof, a magnetic field $H_1$ is applied to the magnetic thin film memory element 11ac. As a result, the direction of magnetization of the magnetic layer $\underline{b}$, which contributes to the recording for the memory element 11ac, orients in the same direction as the magnetic field i.e. to the left. If information "1" is previously recorded in the memory element 1ac, this magnetic field $H_1$ does not change the direction (to the left in the drawing) of magnetization, thus, the recorded information "1" is maintained. In FIG. 13, the arrow in the magnetic thin film memory element indicates the direction of the magnetic field $H_1$ generated by the current $I_1$. When information "0" is to be recorded in the memory element 11ac, a voltage $-V_3$ is applied to the data line 13c. Then, a voltage $V'_4$ is applied to the sense line 14a to be switched to the conductive state the switching element 12ac. As a result, a relatively large current $I_o$ in the direction (from the front side of the drawing to the back side thereof) opposite to that of the current $I_1$ is made to flow in the memory element 11ac and data line 15ac. As shown in FIG. 13, the current $I_o$ applies a magnetic field $H_o$ to the magnetic thin film memory element 11ac, so that the direction of magnetization of the magnetic layer b, which contributes to recording for the memory element 11ac, orients to the right, or in the same direction as the magnetic field $H_o$. If information "0" is previously recorded in the memory element 11ac, the magnetic field $H_o$ does not change the direction (to the right) of magnetization of the magnetic layer b and, thus, the recorded information "0" is maintained. In FIG. 13, the arrow in the magnetic thin film memory element on the right-hand side indicates the direction of the magnetic field $H_o$ generated by the current $I_o$.

Figure 14:
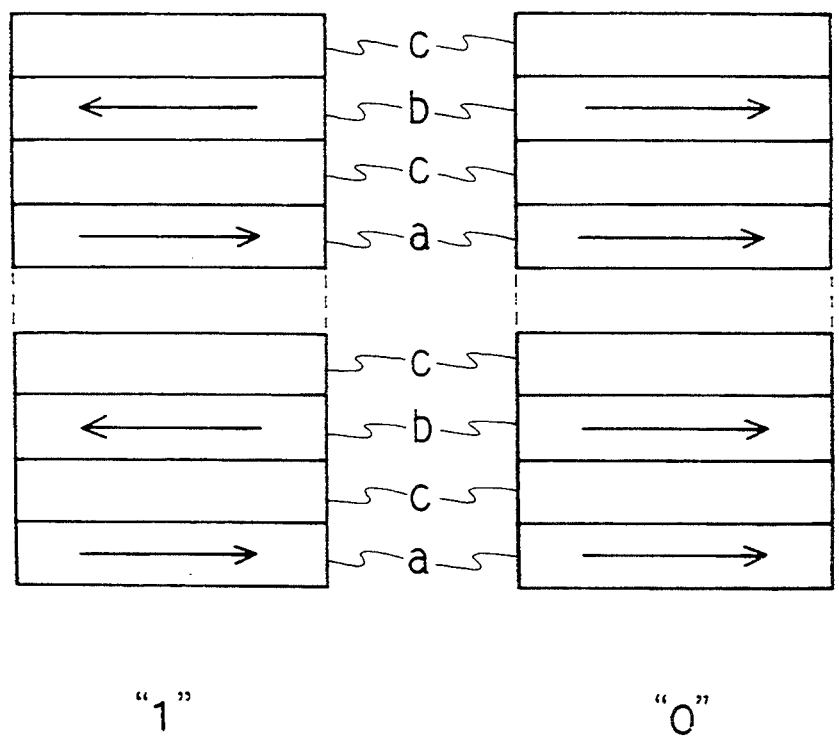
FIG. 14 is a schematic sectional view for showing a state of magnetization of a magnetic thin film.

FIG. 14 is a sectional view of the magnetic thin film memory element 11 in the recording states for "0" or "1" as described above. The direction of magnetization of the magnetic layer a and that of the magnetic layer b are parallel to each other in the recording state for "0" while antiparallel in the recording state for "1". If the wire 15ac is disposed just over the memory element 11ac, the respective directions of magnetic fields generated by current in the memory element 11ac are inversed.

Recording information in other memory elements can be achieved in a manner similar to the above.

As described above, as the switching element in the present invention is used a semiconductor device which does not have a directionality and permits current to flow in either direction. Accordingly, the direction of a current flow in the switching element is dependent on whether the data line 13 and sense line 14, respectively, are applied with the voltages $+V_3$ and $V_4$, or $-V_3$ and $V'_4$. Specifically, as the switching element is used a n-channel MOS-FET of which source and drain regions are completely identical with each other. Hence, current flows in either direction depending on whether the voltage applied to the source and drain is positive or negative. As the switching element, a thyristor or a bipolar type transistor can be employed other than the n-channel MOS-FET.

Since recording is achieved in the manner described above, a data line can also be used as a recording line. Hence, there no need to provide a space for the recording line. This contributes to a reduced space, hence, to a memory of higher density.

Prior to the description on the reproduction method, a brief description is to be made on the magnetic thin film as used for the memory element in Example 4. A multilayer film in which the magnetic layer a having a large coercive force, magnetic layer b having a small coercive force and nonmagnetic layer c are stacked in the sequence of a/c/b/c/a/c/b/c . . . with the nonmagnetic layer c interposed between the magnetic layers a and b and vice versa is used as the magnetic thin film.

Figure 15A:
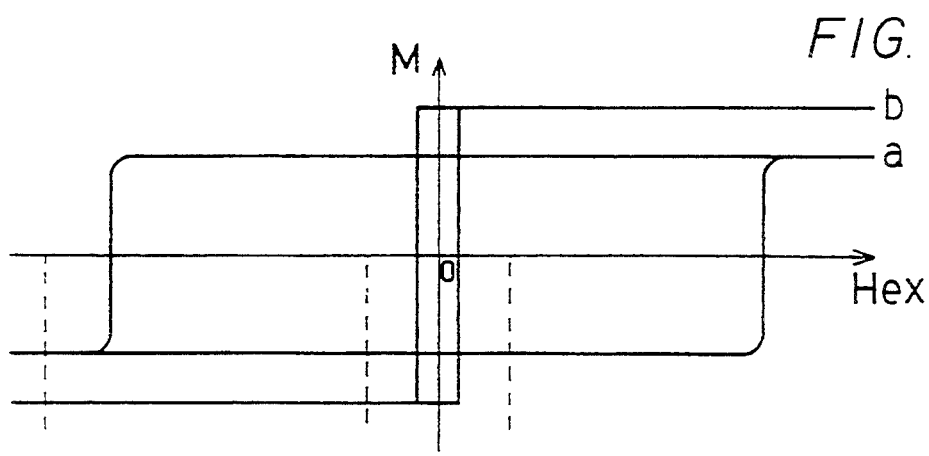
FIGS. 15(a)-15(c) are explanatory views diagrammatically showing a magnetic property of a magnetic thin film and a change in resistance thereof according to the present invention.
Figure 15B:
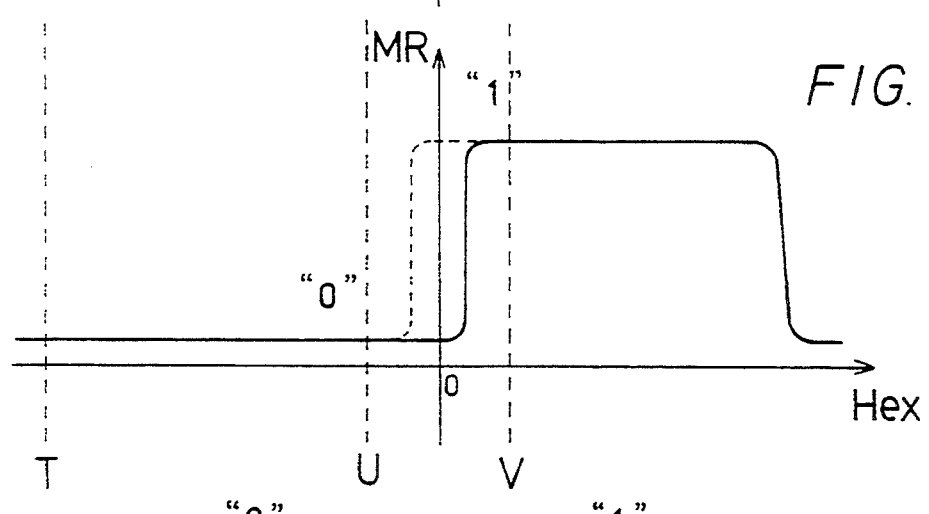
Figure 15C:
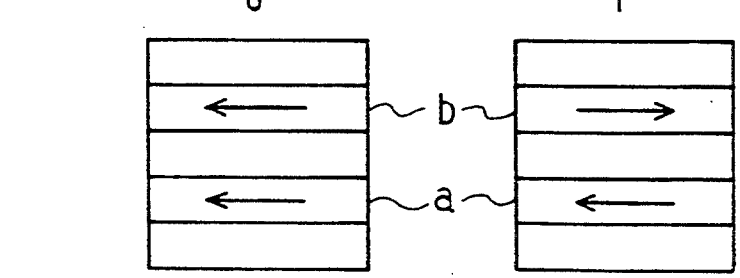

FIGS. 15(a)–15(c) are diagrams comparatively showing a change in magnetization M of each of the magnetic layers a and b and a change in resistance MR of the aforesaid multilayer film with a varying magnetic field externally applied. In FIG. 15, when a magnetic field is applied until intensity point T, the respective directions of magnetization of the magnetic layers a and b are aligned parallel to each for example, to the left. Even if the intensity of the magnetic field is varied until 0 through point U, the respective directions of magnetization of the magnetic layers a and b are kept aligned to the left. Further, when a reverse magnetic field is applied until point V, the direction of magnetization of only the magnetic layer b is inversed and the respective directions of magnetization of the magnetic layers a and b orient antiparallel to each other while the resistance is increased. Even if the magnetic field is varied from this state to 0, the respective directions of magnetization of the magnetic layers a and b are kept in antiparallel to each other. Thereafter, when the magnetic field is varied until point U, the direction of magnetization of the magnetic layer b is reversed again, hence, the respective directions of magnetization of the magnetic layers a and b again orient parallel to each other while the resistance is decreased, whereby the initial state is resumed.

As described above, it is possible to cause the respective directions of magnetization of the magnetic layers a and b to orient parallel or antiparallel to each other by varying the magnetic field between points U and V. Even if the magnetic field returns to 0 thereafter, the orientation state, parallel or antiparallel, is maintained. Further, if the parallel orientation state is determined as "0" and the antiparallel orientation state as "1", binary digit information can be recorded. Since the resistance is dependent on whether the orientation state is parallel or antiparallel, converting the resistance into voltage enables to judge the recorded information to be "0" or "1" with the external magnetic field kept at 0.

The reproduction method using the multilayer film is as follows. When the information recorded in, for example, the magnetic thin film memory element 11ac shown in FIG. 12 is to be read out, a constant current $I_3$ for reproduction is made to flow through the data line 13c, and then an appropriate voltage V is applied to the sense line 14a so as to switch the conductive state of the switching element 12ac. This causes current to flow only in the magnetic thin film memory element 11ac (data line 15ac) from the upper side to the lower side of the drawing. By measuring at that time the voltage V α β across the points α and β, there can be detected as reproduction outputs a voltage $V_A$ in the case where the respective directions of magnetization of the magnetic layers a and b are in parallel to each other and a voltage $V_B$ in the case where they are in antiparallel to each other. Even if the resistance of wiring is taken into consideration, the difference between the voltages $V_A$ and $V_B$ is 5% or more. Therefore, if an appropriate critical voltage is determined, the respective directions of magnetization (spins) can be judged to be parallel, i.e., "0" or antiparallel, i.e., "1" depending on whether the reproduction output is smaller or larger than the critical voltage.

A specific example of the above magnetic thin film will be described along with the producing method therefor.

As the magnetic thin film for the magnetic thin film memory element, a multilayer film was manufactured in which a magnetic layer a having a large coercive force, magnetic layer b having a small coercive force and nonmagnetic layer c are stacked in the sequence of a/c/b/c/a/c/b/c . . . with the nonmagnetic layer c interposed between the magnetic layers a and b and vice versa. As the magnetic layer a was used a NiCoPt alloy film (Ni: 39%, Co: 59%, Pt: 2%) to be referred to as NiCoPt hereinafter. As the magnetic layer b was used a NiFe alloy film (Ni: 80%, Fe: 20%) to be referred to as NiFe hereinafter. As the nonmagnetic layer c was used Cu. As the method for film formation was empoloyed a DC magnetron sputtering method. Three targets such as NiFe, NiCoPt and Cu, were placed in a single chamber of a sputtering apparatus. A Si substrate covered with an insulating film of SiO$_2$ or SIN$_x$, or a glass substrate was used as the substrate. Sputtering was conducted under a pressure of 1 to 8 mTorr, and the film growth rate was about 30 Å per min. A layer of NiCoPt (35 Å thick)/Cu (65 Å thick)/NiFe (35 Å thick)/Cu (65 Å thick) was repeatedly stacked 15 times to form the multilayer film having a thickness size of about 3000 Å in total and a size of 0.5 μm × 1.5 μm. A data line was formed under this multilayer film.

Figures 16A, 16B:
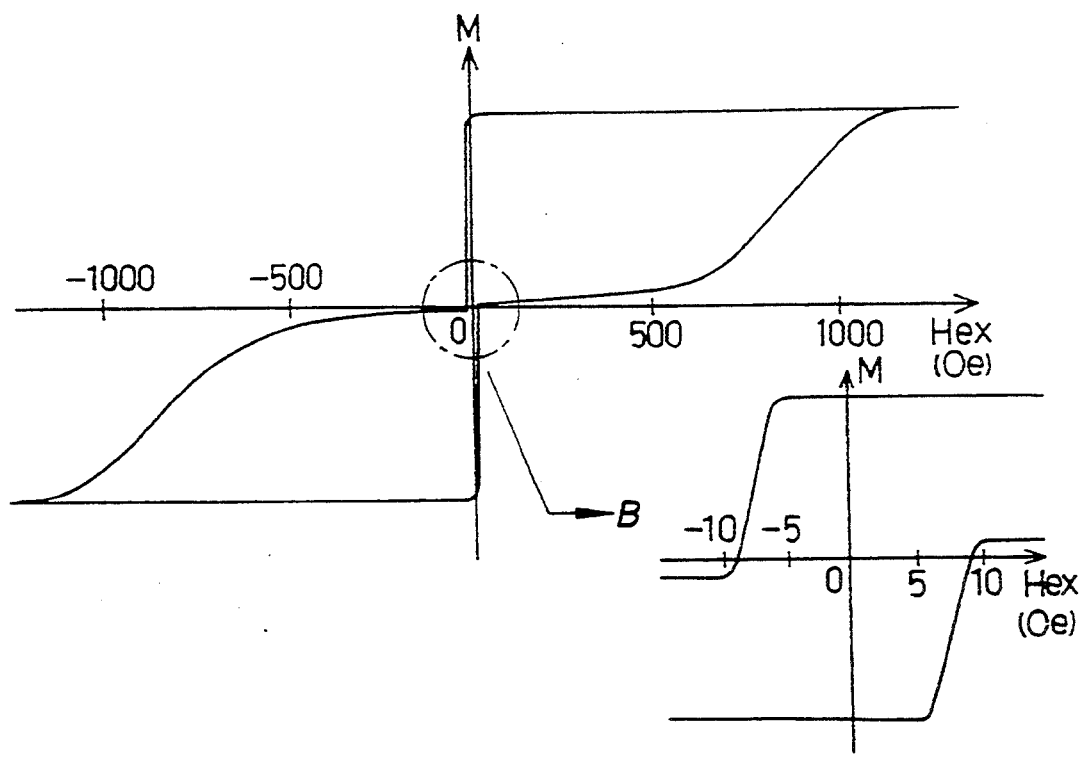
FIGS. 16(a) and 16(b) are diagrams showing a magnetization curve of a magnetic thin film as used in Example 1 of the present invention.
Figures 17A, 17B:
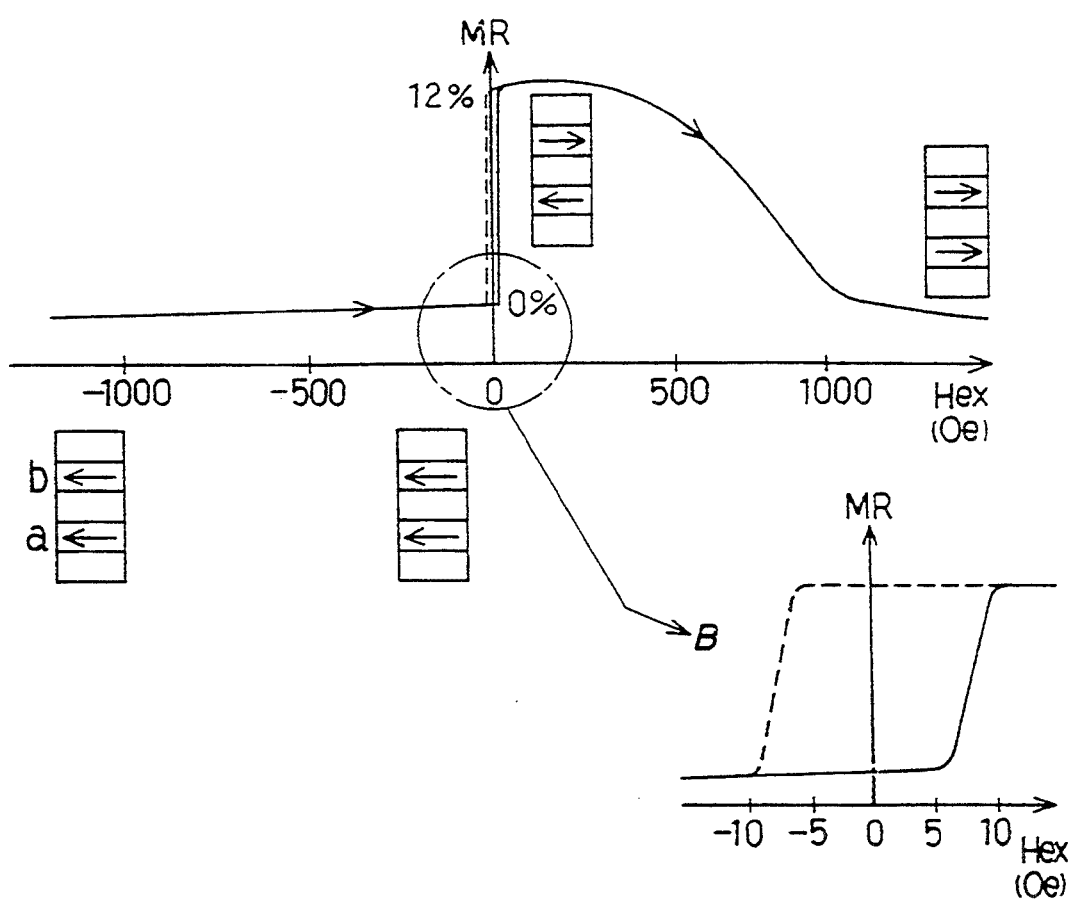
FIGS. 17(a) and 17(b) are diagrams showing a change in resistance of the magnetic thin film as used in Example 1 of the present invention.
Figure 18:
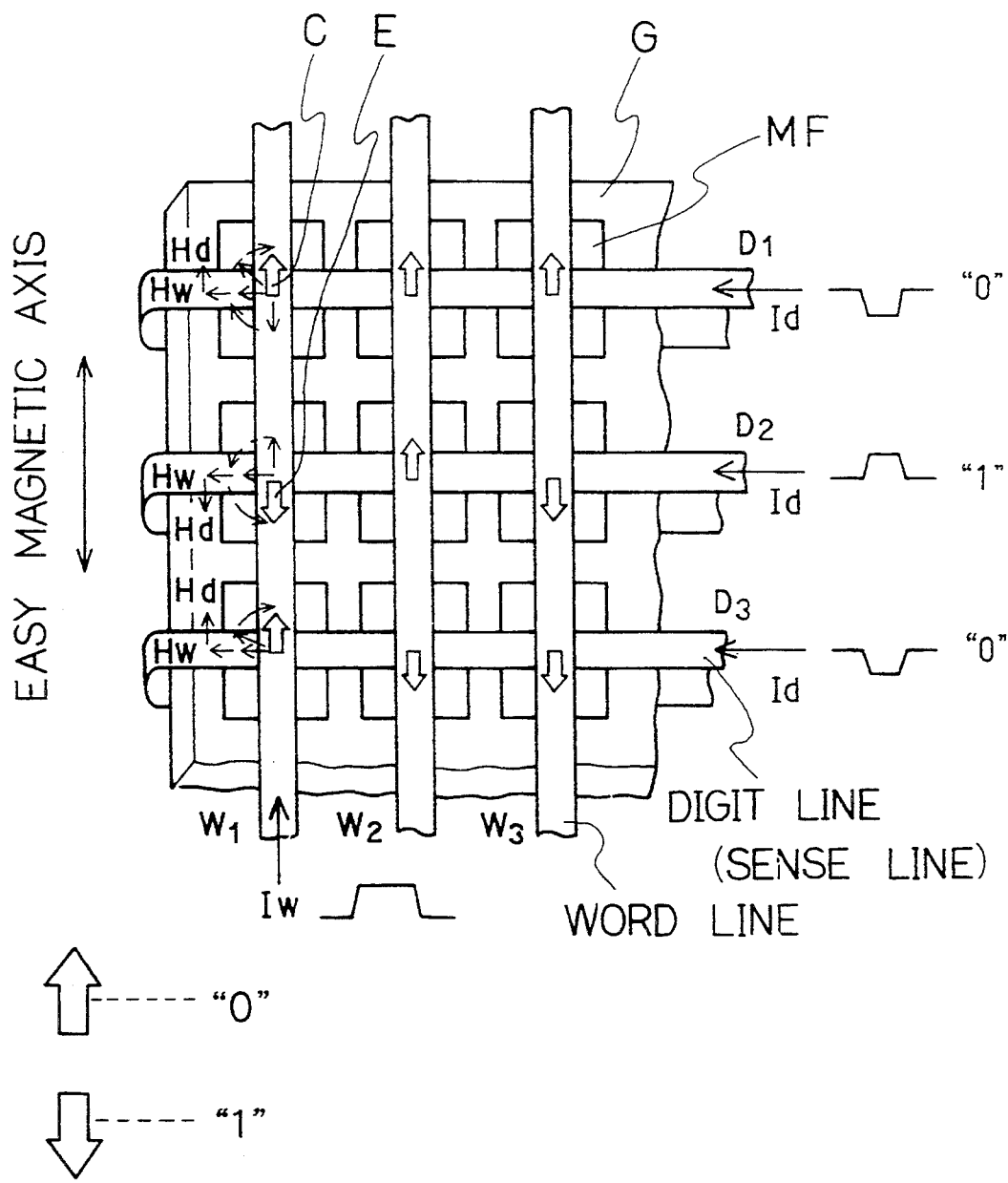
FIG. 18 is an explanatory view schematically illustrating a conventional magnetic thin film memory element in an assembled condition.

Representative magnetization curve and MR curve of the magnetic thin film thus manufactured are shown in FIGS. 16(a), 16(b) and 17(a), 17(b), respectively. FIG. 16(a), 16(b) shows a magnetization curve which appears when an magnetic field is externally applied in a direction in the plane of the thin film. FIG. 16(b) shows a horizontally enlarged diagram of the central portion B in FIG. 16(a). The horizontal axis represents the intensity of the applied magnetic field Hex (Oe), while the vertical axis the intensity of the magnetization M. FIGS. 17(a) and 17(b) show a curve of the resistance MR between the opposite ends of the memory element, which curve is obtained when the magnetic field Hex is externally applied in a direction in the plane of the thin film, and a change of the direction of magnetization of each layer due to the applied magnetic field. FIG. 17(b) shows a horizontally enlarged diagram of the central portion B in FIG. 17(a). In FIG. 17, the horizontal axis represents the intensity of the applied magnetic field Hex (Oe), while the vertical axis the magnitude of the resistance. The magnetization curve exhibits a change in two stages. The change at a proximity of 6 Oe in the first stage indicates an inversion of magnetization of the magnetic layer b, while the change at a proximity of 850 Oe a reversal of magnetization of the magnetic layer a. In the first stage, the magnetization is saturated at 10 Oe. It is seen from the MR curve that the resistance begins to increase at a proximity of 6 Oe and is saturated at a proximity of 10 Oe. This is in good accordance with the inversion of magnetization of the magnetic layer b. In addition, the increased resistance at a proximity of 10 Oe is kept as it is even if a further magnetic field is applied for a while or the magnetic field is decreased to 0. The change rate of the resistance is 12% relative to the resistance prior to the application of the magnetic field. From this, it can be understood that the use of the multilayer film comprising laminated fifteen layers of (NiCoPt/Cu/NiFe/Cu) makes recording and reproduction of information possible if a magnetic field of 10 Oe or more is applied.

EXAMPLE 5

A magnetic thin film memory as shown in FIG. 12 was constructed on a Si substrate covered with an insulating film of SiO$_2$. As the magnetic thin film in this memory, an multilayer film comprising laminated fifteen layers of (NiCoPt/Cu/NiFe/Cu) was formed as in Example 4. A MOS-FET was used as the switching element.

The switching element was formed on the Si substrate covered with SiO$_2$, and data lines 13 and 15 were formed on the drain and source electrodes thereof were respectively formed each having 0.5 μm in width and in thickness. The data line 15 was etched to have about 0.1 μm thickness in the portion thereof to be in contact with the magnetic thin film. The magnetic thin film was formed on such etched portion by sputtering.

In turn, recording and reproduction of information was performed with use of thus constructed magnetic thin film memory.

In recording information, a recording voltage V$_3$=5 V (−V$_3$=−5 V) and a voltage V$_4$=0.1 V (V'$_4$=0.05 V) were applied to the data line 13c and the sense line 14a, respectively. As a result, the switching element 12ac was made to be switched to conductive state and a current of about 5 mA can be flowed in the magnetic thin film memory element 11ac (data line 15 ac). Thus, recording was able to be realized.

In reproduction information, a reproduction current of 1 mA, which was a constant current, was applied to the data line 13c, and an appropriate voltage V (0.5 V) was applied to the sense line 14a to make the switching element 12ac is switched to the conductive state. The voltage Vα β across the opposite ends of the memory element 11ac at that time was measured. The measurement showed that there was a difference of abut 5% in voltage between the state (3.43 V) where "1" was recorded and the state (3.27 V) where "0" was recorded. Therefore, by setting a critical voltage at 3.35 V, judgement was able to be made on whether the recorded information was "1" or "0".

As has been described, with the magnetic thin film memory of the present invention a MR layer is used exhibiting a larger MR effect, hence, a large signal amplitude can be obtained, so that the SN ratio is greatly improved. As a result, there is no need to carry out the data-averaging operation, the access time for reproduction and the data-transfer rate can markedly improved, and the magnetic thin film memory can be applied to many kinds of technical field of the memory.

Furthermore, a memory element is constructed of a magnetic thin film in which a magnetic layer a having a large coercive force, magnetic layer b having a small coercive force and nonmagnetic layer c are stacked in the sequence of a/c/b/c/a/c/b/c ..., and a switching element. Thereby, by applying a magnetic field in parallel to the plane of the magnetic thin film to the magnetic thin film using a line which also functions as a reproduction line, the direction of a current flow in that line can be changed, thereby changing the direction of magnetization of the magnetic layer b. By this, "0" and "1" can be recorded. When reproduction of recorded information is performed, a large difference in resistance between the state where the respective directions of magnetization spin of the magnetic layers a and b are parallel to each other and the state where they are antiparallel to each other is utilized. Accordingly, the recording state for "0" or "1" can be judged if a comparison is made between the voltage V$_B$ across the opposite ends of the memory element when the respective directions of magnetization of the magnetic layers a and b are antiparallel to each other and the voltage V$_A$ thereof when such directions are parallel to each other.

Since the magnetic thin film of the above stacked structure is used as the memory element, recording can be achieved by applying to the magnetic thin film a magnetic field which is in parallel to the plane of the thin film. Further, the provision of one switching element for sensing in each memory element makes it possible to perform both recording and reproduction with the same line. Therefore, there is no need to particularly provide a line for recording. Hence, a magnetic thin film memory of higher density is feasible.

In addition, since there is utilized the difference in resistance between when the respective directions of magnetization of the magnetic layers a and b are parallel to each other and when they are antiparallel to each other, reproduction of recorded information can be achieved without application of a bias magnetic field. Also, the rate of change in resistance is relatively large, which facilitates detection of regenerative signals.

Though several embodiments of the present invention are described above, it is to be understood that the present invention is not limited only to the above-mentioned, various changes and modifications may be made in the invention without departing from the spirit and scope thereof.

What is claimed is:

1. A magnetic thin film memory element comprising:
    at least two kinds of magnetic layers composed of a magnetic material having a large coercive force and another magnetic material having a small coercive force, and
    a nonmagnetic layer which is interposed between said magnetic layers,
    wherein said two kinds of magnetic layers are stacked so as to be coupled with each other across said nonmagnetic layer by an exchange interaction and said magnetic layers and nonmagnetic layer are each made of a conductor.

2. The magnetic thin film memory element of claim 1, wherein said at least two kinds of magnetic layers are coupled to each other so that the respective directions of magnetization thereof are parallel to each other when an external magnetic field is absent.

3. The magnetic thin film memory element of claim 1, wherein said at least two kinds of magnetic layers are coupled to each other so that the respective directions of magnetization thereof are antiparallel to each other when an external magnetic field is absent.

4. The magnetic thin film memory element of claim 1, wherein said nonmagnetic layer is mainly composed of Cu.

5. A magnetic thin film memory comprising a plurality of memory elements of the type recited in claim 1 which are arranged in a matrix pattern, sense line connecting row or column of the memory elements in series, and word line disposed adjacent a line of the memory elements crossing the sense line.

6. The magnetic thin film memory of claim 5, wherein said plurality of memory elements are arranged so that respective easy magnetic axes of the magnetic layers of each of said memory elements orient substantially parallel to said sense line.

7. The magnetic thin film memory of claim 5, wherein said plurality of memory elements are arranged so that respective easy magnetic axes of the magnetic layers of each of said memory elements orient substantially perpendicular to said word line.

8. A magnetic thin film memory comprising:
    at least two kinds of magnetic layers composed of a magnetic material having a large coercive force and another magnetic material having a small coercive force, and
    a nonmagnetic layer which is interposed between said magnetic layers,
    wherein said two kinds of magnetic layers are stacked so as to be coupled with each other across said nonmagnetic layer by an exchange interaction, and
    wherein said memory elements are arranged in the row direction and in the column direction, each magnetic layer of which is formed into a stripe so as to parallel each other, a plurality of word lines arranged so as to closely parallel each other and so as to be crossed by the stripes, and a plurality of sense lines are closely arranged on the stripes with which the word lines are not crossed.

9. A method for recording information in a magnetic thin film memory including memory elements comprising at least two kinds of magnetic layers composed of a magnetic material having a large coercive force and another magnetic material having a small coercive force, and a nonmagnetic layer which is interposed between said magnetic layers, said two kinds of magnetic layers being stacked so as to be coupled with each other across said nonmagnetic layer by an exchange interaction, and said memory elements arranged in a matrix pattern of sense lines and word lines, said method comprising: determining a direction of magnetization of the magnetic layer having a large coercive force with a composite magnetic field produced by making current flow through the word line and the sense line, and changing a direction of the current flowing through the word line to record states of "0" and "1".

10. The method of claim 9, wherein recording is effected so that said direction of magnetization orients substantially parallel to the sense line.

11. The method of claim 9, wherein recording is effected so that said direction of magnetization orients substantially perpendicular to the word line.

12. A method for reproducing information in a magnetic thin film memory including memory elements comprising at least two kinds of magnetic layers composed of a magnetic material having a large coercive force and another magnetic material having a small coercive force, and a nonmagnetic layer which is interposed between said magnetic layers, said two kinds of magnetic layers being stacked so as to be coupled with each other across said nonmagnetic layer by an exchange interaction, said memory elements arranged in a matrix pattern of sense lines and word lines, said reproducing method comprising: utilizing a change in resistance due to a reversal of magnetization of only the magnetic layer having a small coercive force in each of the memory elements which is caused by a magnetic field produced by word current for reproduction.

13. The method of claim 12, wherein said change in resistance is measured between the opposite ends of said sense line connecting a row or column of the memory elements in series.

14. The method of claim 12, wherein said magnetic field produced by said word current is larger than a magnetic field reversing magnetization of the magnetic layer having a small coercive force and smaller than a magnetic field reversing the magnetization of the magnetic layer having a large coercive force.

15. A magnetic thin film memory comprising a plurality of magnetic thin film memory elements each adapted to record information on the basis of the direction of magnetization of a magnetic thin film thereof,
    each of the magnetic thin film memory elements being composed of at least the magnetic thin film and a switching element,
    wherein said magnetic thin film is composed of a multilayer film in which a magnetic layer a having a large coercive force, a magnetic layer b having a small coercive force and a nonmagnetic layer c are stacked in the sequence of a/c/b/c/a/c/b/c ... with the nonmagnet layer c interposed between the magnetic layer a and the magnetic layer b and between the magnetic layer b and the magnetic layer a; and wherein data to be recorded corresponds to the direction of magnetization of the magnetic layer b having a small coercive force.

16. The magnetic thin film memory of claim 15, wherein said switching element comprises a semiconductor device which does not have a definite directionality and allows current to flow in any of positive and negative directions.

17. The magnetic thin film memory of claim 15, wherein one of said plurality of magnetic thin film memory elements is selected by said switching element so as to record information therein or reproduce recorded information therefrom.

18. The magnetic thin film memory of claim 15, wherein both recording of information and reproduction thereof are achieved using only the data line which is disposed in contact with said magnetic thin film.

19. A method for recording information in a magnetic thin film memory, using only a data line disposed in contact with a magnetic thin film in which a magnetic layer a having a large coercive force, a magnetic layer b having a small coercive force and a nonmagnetic layer c are stacked in the sequence of a/c/b/c/a/c/b/c ... with the nonmagnetic layer c interposed between the magnetic layer a and the magnetic layer b and between the magnetic layer b and the magnetic layer a; and changing the direction of magnetization of the magnetic layer b on the basis of the direction of the current to flow through the data line.

20. The method of claim 19, wherein a magnetic field which is generated by said current does not change the direction of magnetization of said magnetic layer a having a large coercive force.

21. A method for reproducting information recorded in a magnetic thin film memory comprising: reading out a signal by utilizing a difference in the resistance of a magnetic thin film in which a magnetic layer a having a large coercive force, a magnetic layer b having a small coercive force and a nonmagnetic layer c are stacked in the sequence of a/c/b/c/a/c/b/c ... with the nonmagnetic layer c interposed between the magnetic layer a and the magnetic layer b and between the magnetic layer b and the magnetic layer a, which difference is produced by a change of the direction of magnetization of the magnetic layer b having a small coercive force.

* * * * *